United States Patent [19]
Takiyama

[11] Patent Number: 5,559,351
[45] Date of Patent: Sep. 24, 1996

[54] SEMICONDUCTOR ELEMENT HAVING CR IN SILICON DIOXIDE

[75] Inventor: Makoto Takiyama, Tokyo, Japan

[73] Assignee: Nippon Steel Corporation, Tokyo, Japan

[21] Appl. No.: 274,558

[22] Filed: Jul. 13, 1994

[30] Foreign Application Priority Data

Jul. 13, 1993 [JP] Japan .................................. 5-195384
Jul. 13, 1993 [JP] Japan .................................. 5-195385

[51] Int. Cl.$^6$ .................................................. H01L 29/792
[52] U.S. Cl. .......................... 257/324; 257/325; 257/402; 257/405; 257/406; 257/410; 257/411
[58] Field of Search .................................. 257/410, 405, 257/406, 411, 412, 325, 324, 402

[56] References Cited

U.S. PATENT DOCUMENTS 3,999,209  12/1976  Wrigley et al. ........................ 257/410
4,837,610   6/1989  Hiratsuka et al. ..................... 257/410

FOREIGN PATENT DOCUMENTS 52-10672  1/1977  Japan .................................. 257/410

OTHER PUBLICATIONS

Aronwitz, et al., "Modification of Interfacial Charge Between $SiO_2$ and Silicon", Appl. Phys. Lett., 52(11), 14 Mar. 1988, pp. 913–915.

Krusin–Elbaum, et al., "Shifts in the Flatband Voltage of Metal–Oxide–Silicon Structure Due to Iodine in $SiO_2$", Appl. Phys. Lett., 48(2), pp. 177–179.

Krusin–Elbaum et al., "Dependence of the Flatband Voltage of Si–MOS on Distribution of Cesium in $SiO_2$", Electrochemical Soc., vol. 133, No. 8, Aug. 1986, pp. 1712–1715.

Takiyama, et al., "Electrical Characteristics of MOS Diode Contaminated with Cr–1", Japan Society of Applied Physics, 430a–SY–14, 1981, p. 707.

Takiyama et al., "Thermal Process Dependence of Chromium Donor/Acceptor in Silicon", Material Science Forum, vol. 117–118, 1993, pp. 261–266.

Nakanishi, et al., "Reliability of Metal–Implanted $SiO_2$," Japan Society of Applied Physics, 28a–V–7, 1991, p. 592.

Primary Examiner—William Mintel
Attorney, Agent, or Firm—Pollock, Vande Sande & Priddy

[57] ABSTRACT

A semiconductor element including a silicon substrate, a silicon oxide film formed on the silicon substrate, and a top electrode formed on the silicon oxide film, wherein chromium is included only in a region of the silicon oxide film, the region including the interface between the silicon oxide film and the top electrode and the vicinity of the interface, and the method of manufacturing the same.

29 Claims, 28 Drawing Sheets

CONCENTRATION OF CHROMIUM IN
NITRIC ACID SOLUTION [ ppm ]

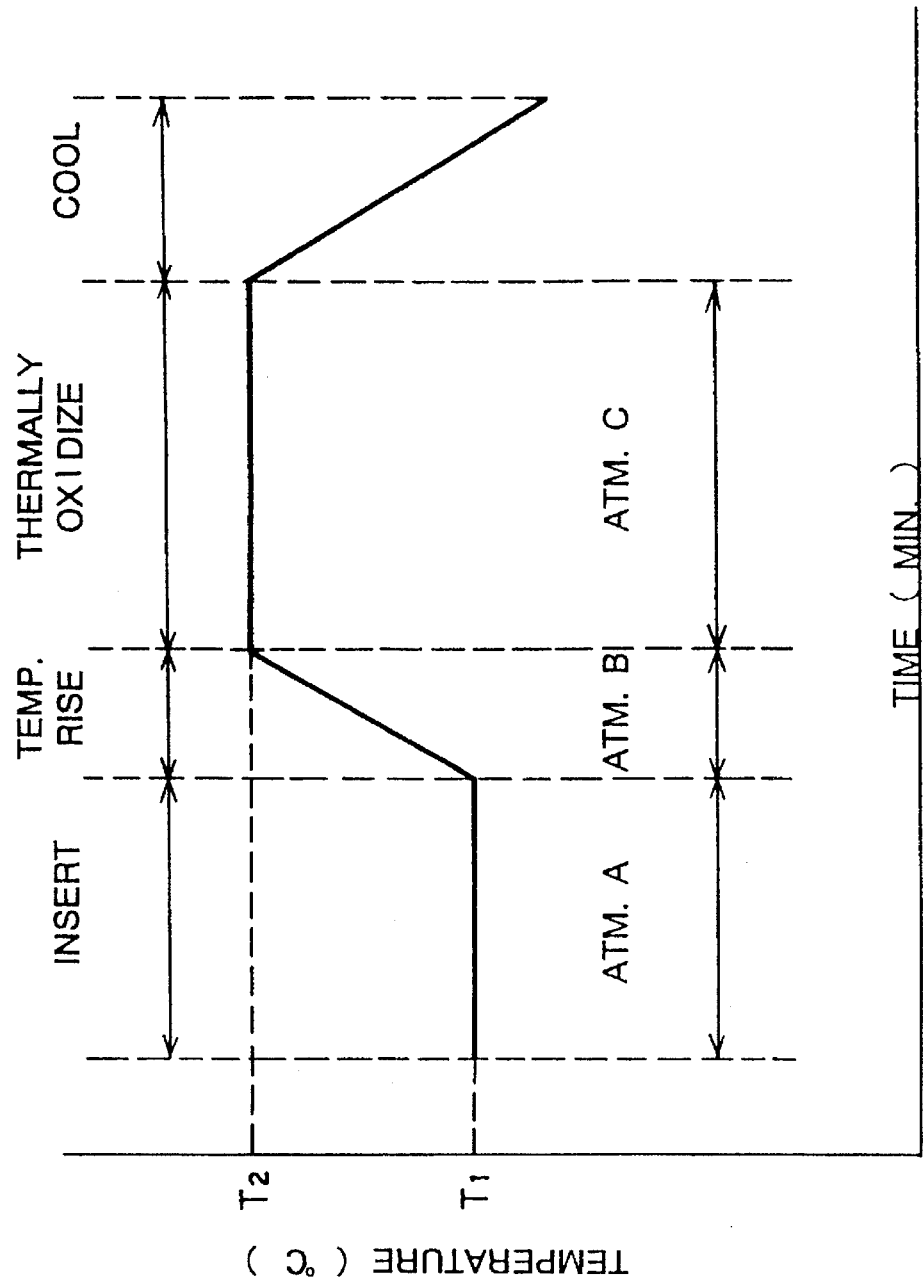

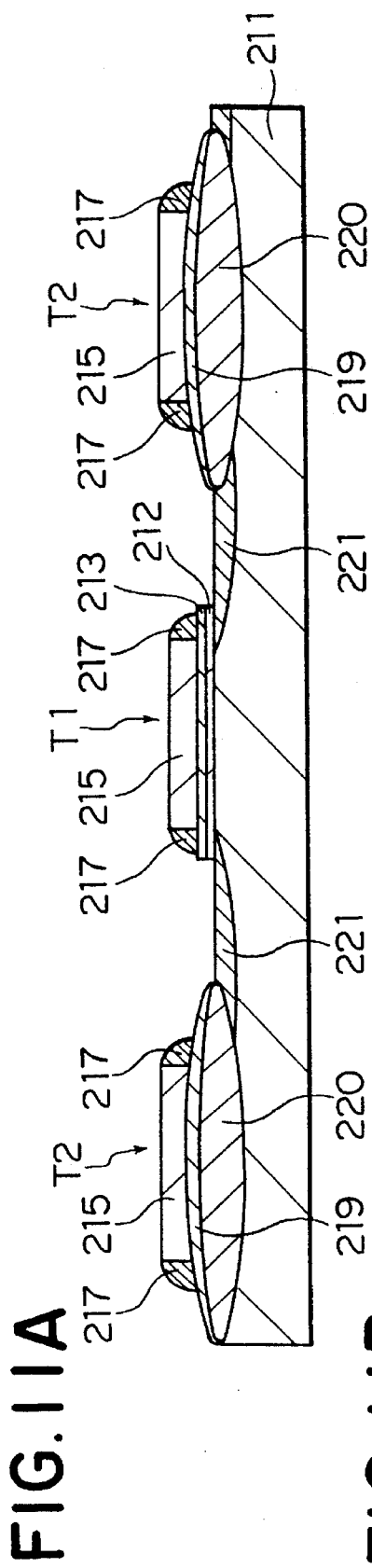
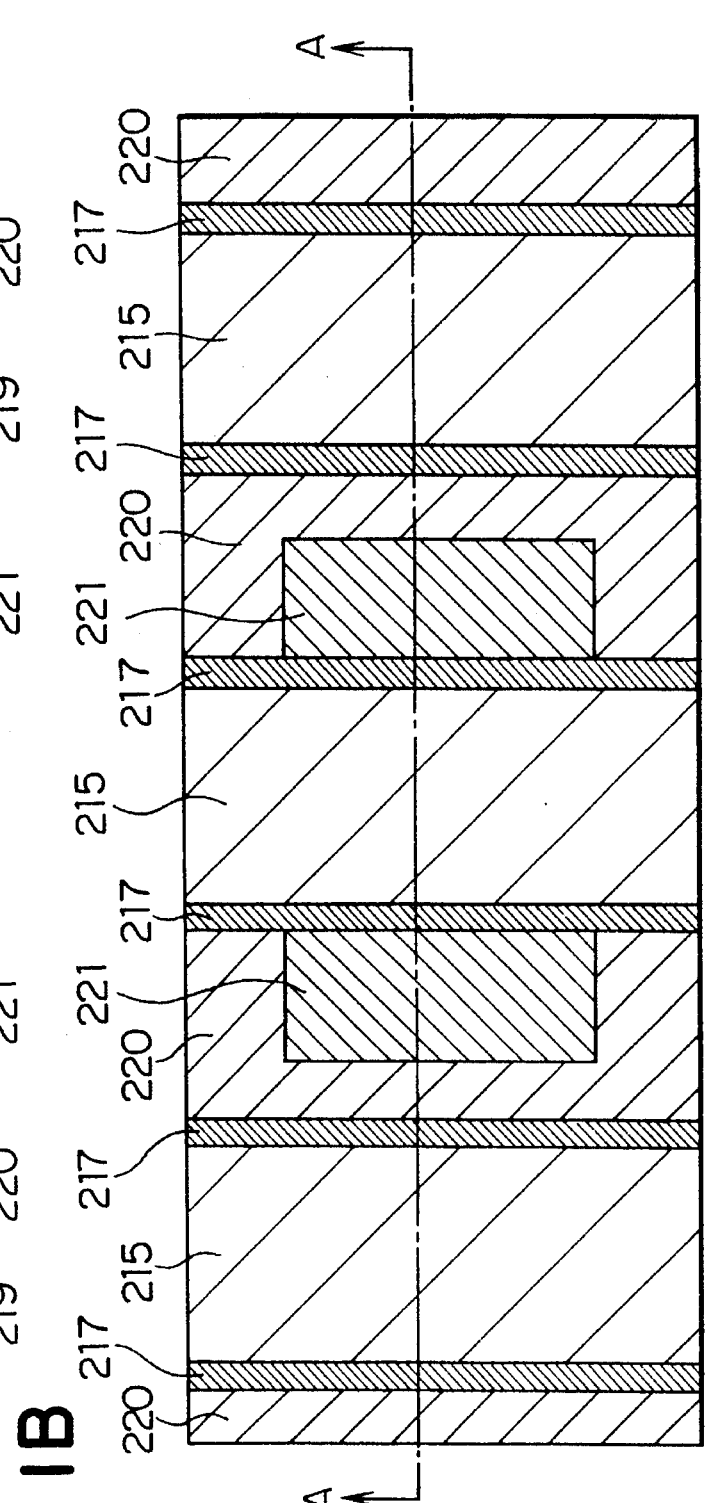
FIG. IIA
FIG. IIB

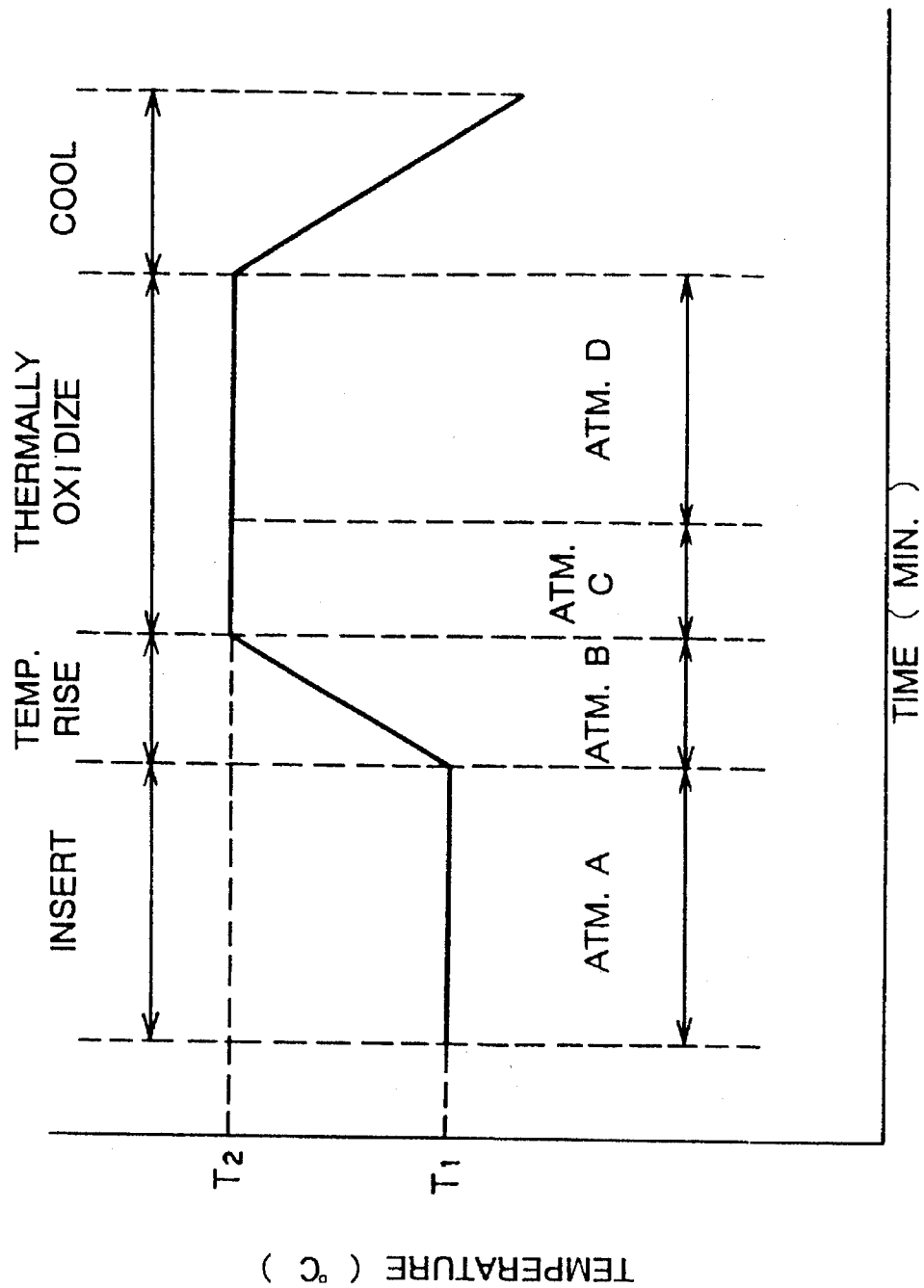

FIG. 19

| PROPORTION OF Cr-INCLUDING REGION OCCUPIED IN THE THICKNESS OF SILICON OXIDE FILM | ADVERSE AFFECT ON DIELECTRIC BREAKDOWN VOLTAGE OF SILICON OXIDE FILM |
|---|---|
| 60% ≧ | NOT RECOGNIZED |
| 61~65% | NOT RECOGNIZED |
| 66~70% | NOT RECOGNIZED |
| 71~75% | SOMEWHAT RECOGNIZED BUT PRACTICAL |
| 76~80% | RECOGNIZED |
| 80% ≦ | RECOGNIZED |

FIG. 20

| KIND OF SOLUTION | | THRESHOLD CONTROL | DIELECTRIC BREAKDOWN VOLTAGE OF SILICON OXIDE FILM | GENERATION LIFETIME |
|---|---|---|---|---|
| INORGANIC SOLUTION | $HNO_3$ SOL. | VERY EFFECTIVE | NOT ADVERSELY AFFECTED | NOT ADVERSELY AFFECTED |
| | HCL SOL. | VERY EFFECTIVE | NOT ADVERSELY AFFECTED | NOT ADVERSELY AFFECTED |
| | HF SOL. | VERY EFFECTIVE | NOT ADVERSELY AFFECTED | NOT ADVERSELY AFFECTED |
| | $H_2SO_4$ SOL. | VERY EFFECTIVE | NOT ADVERSELY AFFECTED | NOT ADVERSELY AFFECTED |
| | $CH_3COOH$ SOL. | VERY EFFECTIVE | NOT ADVERSELY AFFECTED | NOT ADVERSELY AFFECTED |
| | $H_3PO_4$ SOL. | VERY EFFECTIVE | NOT ADVERSELY AFFECTED | NOT ADVERSELY AFFECTED |
| | $NH_4OH$ SOL. | VERY EFFECTIVE | NOT ADVERSELY AFFECTED | NOT ADVERSELY AFFECTED |
| | MIXTURE OF ANY TWO OF THOSE SOLS. | VERY EFFECTIVE | SOMEWHAT ADVERSELY AFFECTED | SOMEWHAT ADVERSELY AFFECTED |
| | MIXTURE OF ANY THREE OF THOSE SOLS. | VERY EFFECTIVE | SOMEWHAT ADVERSELY AFFECTED | SOMEWHAT ADVERSELY AFFECTED |
| ORGANIC SOLUTION | ACETONE SOL. | SLIGHTLY EFFECTIVE | NOT ADVERSELY AFFECTED | NOT ADVERSELY AFFECTED |
| | METHANOL SOL. | SLIGHTLY EFFECTIVE | NOT ADVERSELY AFFECTED | NOT ADVERSELY AFFECTED |
| | ETHANOL SOL. | SLIGHTLY EFFECTIVE | NOT ADVERSELY AFFECTED | NOT ADVERSELY AFFECTED |
| | MIXTURE OF ANY TWO OF THOSE SOLS. | SLIGHTLY EFFECTIVE | NOT ADVERSELY AFFECTED | NOT ADVERSELY AFFECTED |
| | MIXTURE OF ANY THREE OF THOSE SOLS. | SLIGHTLY EFFECTIVE | NOT ADVERSELY AFFECTED | NOT ADVERSELY AFFECTED |

FIG. 21

| KIND OF SOLUTION | | THRESHOLD CONTROL | DIELECTRIC BREAKDOWN VOLTAGE OF SILICON OXIDE FILM | GENERATION LIFETIME |
|---|---|---|---|---|
| INORGANIC SOLUTION | $HNO_3$ SOL. | VERY EFFECTIVE | NOT ADVERSELY AFFECTED | NOT ADVERSELY AFFECTED |
| | HCL SOL. | VERY EFFECTIVE | NOT ADVERSELY AFFECTED | NOT ADVERSELY AFFECTED |
| | HF SOL. | SLIGHTLY EFFECTIVE | NOT ADVERSELY AFFECTED | NOT ADVERSELY AFFECTED |
| | $H_2SO_4$ SOL. | SLIGHTLY EFFECTIVE | SOMEWHAT ADVERSELY AFFECTED | NOT ADVERSELY AFFECTED |
| | $CH_3COOH$ SOL. | SLIGHTLY EFFECTIVE | NOT ADVERSELY AFFECTED | NOT ADVERSELY AFFECTED |
| | $H_3PO_4$ SOL. | SLIGHTLY EFFECTIVE | NOT ADVERSELY AFFECTED | NOT ADVERSELY AFFECTED |
| | $NH_4OH$ SOL. | VERY EFFECTIVE | NOT ADVERSELY AFFECTED | NOT ADVERSELY AFFECTED |
| | MIXTURE OF ANY TWO OF THOSE SOLS. | MODERATELY EFFECTIVE | SOMEWHAT ADVERSELY AFFECTED | SOMEWHAT ADVERSELY AFFECTED |
| | MIXTURE OF ANY THREE OF THOSE SOLS. | MODERATELY EFFECTIVE | SOMEWHAT ADVERSELY AFFECTED | SOMEWHAT ADVERSELY AFFECTED |
| ORGANIC SOLUTION | ACETONE SOL. | SLIGHTLY EFFECTIVE | NOT ADVERSELY AFFECTED | NOT ADVERSELY AFFECTED |
| | METHANOL SOL. | SLIGHTLY EFFECTIVE | NOT ADVERSELY AFFECTED | NOT ADVERSELY AFFECTED |
| | ETHANOL SOL. | SLIGHTLY EFFECTIVE | NOT ADVERSELY AFFECTED | NOT ADVERSELY AFFECTED |
| | MIXTURE OF ANY TWO OF THOSE SOLS. | SLIGHTLY EFFECTIVE | NOT ADVERSELY AFFECTED | NOT ADVERSELY AFFECTED |
| | MIXTURE OF ANY THREE OF THOSE SOLS. | SLIGHTLY EFFECTIVE | NOT ADVERSELY AFFECTED | NOT ADVERSELY AFFECTED |

FIG. 22

| INSERTION SPEED | INSERTION TEMPERATURE | | | | | | |
|---|---|---|---|---|---|---|---|
| | 700°C | 800°C | 900°C | 1000°C | 1100°C | 1150°C | 1200°C |
| 10mm/MIN. | NOT CHANGED | NOT CHANGED | CHANGED | CHANGED | CHANGED | CHANGED | CHANGED |
| 20mm/MIN. | NOT CHANGED | NOT CHANGED | NOT CHANGED | CHANGED | CHANGED | CHANGED | CHANGED |
| 30mm/MIN. | NOT CHANGED | NOT CHANGED | NOT CHANGED | CHANGED | CHANGED | CHANGED | CHANGED |
| 40mm/MIN. | NOT CHANGED | NOT CHANGED | NOT CHANGED | CHANGED | CHANGED | CHANGED | CHANGED |
| 50mm/MIN. | NOT CHANGED | NOT CHANGED | NOT CHANGED | NOT CHANGED | CHANGED | CHANGED | CHANGED |
| 60mm/MIN. | NOT CHANGED | NOT CHANGED | NOT CHANGED | NOT CHANGED | CHANGED | CHANGED | CHANGED |
| 70mm/MIN. | NOT CHANGED | NOT CHANGED | NOT CHANGED | NOT CHANGED | CHANGED | CHANGED | CHANGED |
| 80mm/MIN. | NOT CHANGED | NOT CHANGED | NOT CHANGED | NOT CHANGED | NOT CHANGED | CHANGED | CHANGED |
| 90mm/MIN. | NOT CHANGED | NOT CHANGED | NOT CHANGED | NOT CHANGED | NOT CHANGED | CHANGED | CHANGED |
| 100mm/MIN. | NOT CHANGED | NOT CHANGED | NOT CHANGED | NOT CHANGED | NOT CHANGED | NOT CHANGED | CHANGED |
| 150mm/MIN. | NOT CHANGED | NOT CHANGED | NOT CHANGED | NOT CHANGED | NOT CHANGED | NOT CHANGED | CHANGED |
| 200mm/MIN. | NOT CHANGED | NOT CHANGED | NOT CHANGED | NOT CHANGED | NOT CHANGED | NOT CHANGED | CHANGED |

FIG. 23

| INITIAL OXIDE FILM THICKNESS | OXDIZING TEMP. | CARRIER CONT. IN SUBSTRATE | THRESHOLD VOLTAGE |
|---|---|---|---|
| 0~20Å (THICKNESS OF OXIDE FILM INCLUDING Cr COMPONENT : 300~280Å) | 800°C<br>900°C<br>1000°C<br>1100°C<br>1150°C<br>1200°C | NOT CHANGED<br>NOT CHANGED<br>NOT CHANGED<br>CHANGED<br>CHANGED<br>CHANGED | CHANGED<br>CHANGED<br>CHANGED<br>CHANGED<br>CHANGED<br>CHANGED |
| 21~50Å (THICKNESS OF OXIDE FILM INCLUDING Cr COMPONENT : 279~250Å) | 800°C<br>900°C<br>1000°C<br>1100°C<br>1150°C<br>1200°C | NOT CHANGED<br>NOT CHANGED<br>NOT CHANGED<br>NOT CHANGED<br>CHANGED<br>CHANGED | CHANGED<br>CHANGED<br>CHANGED<br>CHANGED<br>CHANGED<br>CHANGED |
| 51~100Å (THICKNESS OF OXIDE FILM INCLUDING Cr COMPONENT : 249~200Å) | 800°C<br>900°C<br>1000°C<br>1100°C<br>1150°C<br>1200°C | NOT CHANGED<br>NOT CHANGED<br>NOT CHANGED<br>NOT CHANGED<br>NOT CHANGED<br>CHANGED | CHANGED<br>CHANGED<br>CHANGED<br>CHANGED<br>CHANGED<br>CHANGED |
| 101~200Å (THICKNESS OF OXIDE FILM INCLUDING Cr COMPONENT : 199~200Å) | 800°C<br>900°C<br>1000°C<br>1100°C<br>1150°C<br>1200°C | NOT CHANGED<br>NOT CHANGED<br>NOT CHANGED<br>NOT CHANGED<br>NOT CHANGED<br>NOT CHANGED | CHANGED<br>CHANGED<br>CHANGED<br>CHANGED<br>CHANGED<br>IMPRACTICAL |
| 201~250Å (THICKNESS OF OXIDE FILM INCLUDING Cr COMPONENT : 99~50Å) | 800°C<br>900°C<br>1000°C<br>1100°C<br>1150°C<br>1200°C | NOT CHANGED<br>NOT CHANGED<br>NOT CHANGED<br>NOT CHANGED<br>NOT CHANGED<br>NOT CHANGED | NOT CHANGED<br>NOT CHANGED<br>NOT CHANGED<br>IMPRACTICAL<br>IMPRACTICAL<br>IMPRACTICAL |
| 250~290Å (THICKNESS OF OXIDE FILM INCLUDING Cr COMPONENT : 50~0Å) | 800°C<br>900°C<br>1000°C<br>1100°C<br>1150°C<br>1200°C | NOT CHANGED<br>NOT CHANGED<br>NOT CHANGED<br>NOT CHANGED<br>NOT CHANGED<br>NOT CHANGED | CHANGED<br>IMPRACTICAL<br>IMPRACTICAL<br>IMPRACTICAL<br>IMPRACTICAL<br>IMPRACTICAL |

FIG. 24

| TEMP. | CARRIER CONT. IN SUBSTRATE | THRESHOLD VOLTAGE CONTROL |
|---|---|---|
| 200°C | NOT CHANGED | INEFFECTIVE |
| 300°C | NOT CHANGED | INEFFECTIVE |
| 350°C | NOT CHANGED | INEFFECTIVE |
| 400°C | NOT CHANGED | INEFFECTIVE |
| 450°C | NOT CHANGED | SLIGHTLY EFFECTIVE |
| 500°C | NOT CHANGED | SLIGHTLY EFFECTIVE |
| 600°C | NOT CHANGED | EFFECTIVE |
| 700°C | NOT CHANGED | EFFECTIVE |
| 800°C | NOT CHANGED | EFFECTIVE |
| 900°C | NOT CHANGED | EFFECTIVE |
| 1000°C | NOT CHANGED | EFFECTIVE |
| 1050°C | NOT CHANGED | EFFECTIVE |
| 1100°C | NOT CHANGED | EFFECTIVE |
| 1150°C | NOT CHANGED | EFFECTIVE |
| 1200°C | CHANGED | EFFECTIVE |

FIG. 25

| OXIDE CONT. | OXIDE FILM THICKNESS | THRESHOLD VOLTAGE CONTROL |
|---|---|---|
| 50% | CHANGED | EFFECTIVE |
| 40% | CHANGED | EFFECTIVE |
| 30% | CHANGED | EFFECTIVE |
| 20% | CHANGED | EFFECTIVE |
| 10% | CHANGED | EFFECTIVE |
| 7% | CHANGED | EFFECTIVE |
| 6% | SLIGHTLY CHANGED | EFFECTIVE |
| 5% | NOT CHANGED | EFFECTIVE |
| 4% | NOT CHANGED | EFFECTIVE |
| 2% | NOT CHANGED | EFFECTIVE |
| 1% | NOT CHANGED | EFFECTIVE |
| 0% | NOT CHANGED | INEFFECTIVE |

FIG. 26

| OXIDE CONT. | OXIDE FILM THICKNESS | THRESHOLD VOLTAGE CONTROL |
|---|---|---|
| 50% | CHANGED | EFFECTIVE |
| 40% | CHANGED | EFFECTIVE |
| 30% | CHANGED | EFFECTIVE |
| 20% | CHANGED | EFFECTIVE |
| 10% | CHANGED | EFFECTIVE |
| 7% | CHANGED | EFFECTIVE |
| 6% | SLIGHTLY CHANGED | EFFECTIVE |
| 5% | NOT CHANGED | EFFECTIVE |
| 4% | NOT CHANGED | EFFECTIVE |
| 3% | NOT CHANGED | EFFECTIVE |
| 2% | NOT CHANGED | LESS EFFECTIVE |
| 1% | NOT CHANGED | INEFFECTIVE |
| 0% | NOT CHANGED | INEFFECTIVE |

FIG. 27

| TEMP. | OXIDE FILM THICKNESS | THRESHOLD VOLTAGE CONTROL | CARRIER CONT. IN SUBSTRATE | OXIDE FILM DIELECTRIC BREAKDOWN VOLTAGE |
|---|---|---|---|---|
| 23°C | NOT CHANGED | INEFFECTIVE | NOT CHANGED | ADVERSELY AFFECTED |
| 300°C | NOT CHANGED | INEFFECTIVE | NOT CHANGED | ADVERSELY AFFECTED |
| 400°C | NOT CHANGED | INEFFECTIVE | NOT CHANGED | ADVERSELY AFFECTED |
| 450°C | NOT CHANGED | INEFFECTIVE | NOT CHANGED | LESS ADVERSELY AFFECTED |
| 500°C | NOT CHANGED | INEFFECTIVE | NOT CHANGED | LESS ADVERSELY AFFECTED |
| 550°C | NOT CHANGED | INEFFECTIVE | NOT CHANGED | LESS ADVERSELY AFFECTED |
| 600°C | NOT CHANGED | SLIGHTLY EFFECTIVE | NOT CHANGED | LESS ADVERSELY AFFECTED |
| 650°C | NOT CHANGED | SLIGHTLY EFFECTIVE | NOT CHANGED | LESS ADVERSELY AFFECTED |
| 700°C | NOT CHANGED | SLIGHTLY EFFECTIVE | NOT CHANGED | NOT ADVERSELY AFFECTED |
| 750°C | NOT CHANGED | SLIGHTLY EFFECTIVE | NOT CHANGED | NOT ADVERSELY AFFECTED |
| 800°C | SLIGHTLY CHANGED | EFFECTIVE | NOT CHANGED | NOT ADVERSELY AFFECTED |
| 850°C | SLIGHTLY CHANGED | EFFECTIVE | NOT CHANGED | NOT ADVERSELY AFFECTED |
| 900°C | SLIGHTLY CHANGED | EFFECTIVE | NOT CHANGED | NOT ADVERSELY AFFECTED |
| 950°C | SLIGHTLY CHANGED | EFFECTIVE | NOT CHANGED | NOT ADVERSELY AFFECTED |
| 1000°C | CHANGED | EFFECTIVE | NOT CHANGED | NOT ADVERSELY AFFECTED |
| 1050°C | CHANGED | EFFECTIVE | CHANGED | NOT ADVERSELY AFFECTED |
| 1100°C | CHANGED | EFFECTIVE | CHANGED | NOT ADVERSELY AFFECTED |

FIG. 28

| TIME | OXIDE FILM THICKNESS | THRESHOLD VOLTAGE CONTROL | CARRIER CONT. IN SUBSTRATE | OXIDE FILM DIELECTRIC BREAKDOWN VOLTAGE |
|---|---|---|---|---|
| 0 MIN. | NOT CHANGED | INEFFECTIVE | NOT CHANGED | ADVERSELY AFFECTED |
| 5 MIN. | NOT CHANGED | SLIGHTLY EFFECTIVE | NOT CHANGED | ADVERSELY AFFECTED |
| 10 MIN. | NOT CHANGED | SLIGHTLY EFFECTIVE | NOT CHANGED | LESS ADVERSELY AFFECTED |
| 15 MIN. | NOT CHANGED | EFFECTIVE | NOT CHANGED | LESS ADVERSELY AFFECTED |
| 20 MIN. | NOT CHANGED | EFFECTIVE | NOT CHANGED | LESS ADVERSELY AFFECTED |
| 30 MIN. | NOT CHANGED | EFFECTIVE | NOT CHANGED | NOT ADVERSELY AFFECTED |
| 40 MIN. | NOT CHANGED | EFFECTIVE | NOT CHANGED | NOT ADVERSELY AFFECTED |
| 50 MIN. | NOT CHANGED | EFFECTIVE | NOT CHANGED | NOT ADVERSELY AFFECTED |
| 60 MIN. | NOT CHANGED | EFFECTIVE | NOT CHANGED | NOT ADVERSELY AFFECTED |
| 90 MIN. | SLIGHTLY CHANGED | EFFECTIVE | CHANGED | NOT ADVERSELY AFFECTED |
| 120 MIN. | CHANGED | EFFECTIVE | CHANGED | NOT ADVERSELY AFFECTED |

SEMICONDUCTOR ELEMENT HAVING CR IN SILICON DIOXIDE

FIELD OF THE INVENTION

The present invention relates to a semiconductor element and a method of manufacturing the same, and more particularly to a semiconductor element which includes a silicon oxide film having a region which includes chromium and a method of manufacturing the same.

BACKGROUND OF THE INVENTION

The threshold voltage of a MOS transistor is affected by four factors: (1) the concentration of impurities in the silicon substrate, (2) a surface potential energy of the interface between the silicon substrate and an oxide film on the substrate, (3) an electrostatic capacitance of the silicon oxide film and (4) a flatband voltage.

The flatband voltage is further influenced by four factors: (5) the difference in a work function between the silicon substrate and a top electrode, (6) charge distribution in the oxide film, (7) a fixed charge quantity in the vicinity of the interface between the silicon substrate and the oxide film and (8) the electrostatic capacitance of the silicon oxide film.

Generally, the threshold voltage of a semiconductor element, such as a MOS transistor, takes a single particular value which is determined as its characteristic in a certain type of the transistor, whereas a plurality of selected values can be set in a transistor of another type by controlling its drive conditions including the gate, source and drain electrode voltages. In the latter case, the threshold voltage of the transistor in this specification indicates a threshold voltage set under a specific drive condition.

In a conventional technique used for controlling a threshold voltage, it is widely known to introduce an impurity, such as boron or phosphorus, intentionally into a silicon substrate in a transistor manufacturing process to thereby control the concentration of the impurity in the silicon substrate or the surface potential energy on the interface between the silicon substrate and its oxide film. It has been already proposed in one of special-purpose MOS transistors to use a top electrode of a different material thereby to control the difference in work function between the silicon substrate and the top electrode. Further, it is known to introduce an impurity, such as calcium, cesium or iodine, into the interface between the silicon substrate and the oxide film by ion implantation, so that the fixed electric charge quantity in the vicinity of the interface between the silicon substrate and its oxide film is controlled, thereby controlling the threshold voltage of the transistor.

The above matters are disclosed, for example, in S. Aronowitz et al., "Modification of interfacial charge between $SiO_2$ and silicon", Appl. Phys. Lett., 52(11), pp.913–915 (1988); L. Krunsin-Elbaum et. al, "Shifts on the flatband voltage of metal-oxide-silicon structure due to iodine in $SiO_2$", Appl. Phys. Lett., 48(2). pp. 177–179 (1986); and L. Krunsin-Elbaum, "Dependence of Flatband Voltage of Si-MOS on Distribution of Cesium in $SiO_2$", J.Electrochem. Soc., Vol. 188, No. 8, pp.1712–1715 (1986).

It is expected, in such conventional techniques, that as the integrated circuits become smaller in size, the number of manufacturing steps or the process time involved in a technique for control of the threshold voltages will increase. In addition, it is also expected that various adverse effects will occur in the process for introducing an impurity. The accompanied process would decrease the performance of the MOS transistor with regard to the dielectric breakdown voltage of the silicon oxide film and the lifetime of minority carriers in the silicon substrate, resulting in reduction of the yield of the integrated circuits.

In contrast, if the threshold voltage is controlled through the distribution of electric charges in the oxide film, the above-mentioned adverse effects will be reduced. This is understood by examining each of the four respective factors (5)–(8) contributing to the flatband voltage. However, a practical method for that purpose has not yet been proposed.

It is known that a change in the threshold voltage is caused by a change in the flatband voltage due to a metal element present in a MOS transistor. In most of the metal elements, however, the change of the flatband voltage is almost caused through a fixed charge quantity in the vicinity of the interface between the silicon substrate and an oxide film on the substrate. No metal element has been discovered which is capable of controlling the threshold voltage of the transistor through distribution of electric charges in the oxide film.

It is considered that the presence of a metal element in a MOS transistor would cause a problem such as an adverse effect on electrical characteristics other than the flatband voltage, for example, the dielectric breakdown voltage of the silicon oxide film and/or the lifetime of minority carriers in the silicon substrate. In order to avoid such a problem, implantation of a metal element into the silicon oxide film is generally avoided intentionally. It is known that chromium in the MOS transistor would change the flatband voltage, but would also simultaneously cause a reduction of the lifetime of the minority carriers and an adverse effect on the dielectric breakdown voltage of the silicon oxide film.

The above matters are disclosed, for example, in M. Takiyama et. al, "Electrical characteristics of MOS diode contaminated with Cr-1", 38th combined Applied Physics and related field society lecture preprint No. 2. 30a-SY-14, p. 707, 1991; "Thermal Process Dependence of Chromium Donor/Acceptor in Silicon" in Material Science Forum, Vol. 115–118, edited by T. Taguchi, Trans. Tech. Pub., 1993, pp.261–266; and T. Nakanishi et. al, "Reliability of Metal-implemented $SiO_2$", 38th combined Applied Physics and related field society lecture preprint No. 2. 28a-V-7, p.592, 1991.

We have discovered that the presence of chromium only in the interface between the silicon oxide film and the top electrode in the silicon oxide film in the vicinity of the interface eliminates the above problems to thereby control the threshold voltage.

SUMMARY OF THE INVENTION

It is an object of the present invention to provide a semiconductor element capable of controlling its threshold voltage on the basis of a change of a the flatband voltage without reducing the dielectric breakdown voltage of the silicon oxide film of the semiconductor element and the lifetime of minority carriers in the silicon substrate.

It is another object of the present invention to provide a method of manufacturing a semiconductor element having a silicon oxide film which includes chromium only in its region including the interface between the silicon oxide film and a top electrode on the oxide film and in a vicinity of the interface.

A semiconductor element, according to the present invention, includes a silicon substrate, a silicon oxide film formed on the silicon substrate and a top electrode formed on the silicon oxide film, wherein chromium is included only in the region of the silicon oxide film including the interface between the silicon oxide film and the top electrode and in a vicinity of the interface.

In a preferred embodiment of the present invention, the chromium concentration is more than $1 \times 10^{15}/cm^3$. The chromium concentration is more than $1 \times 15^{15}/cm^3$ and the region is 75% or less of a thickness of the silicon oxide film. The top electrode includes an added impurity having a concentration of less than $1 \times 10^{22}/cm^3$ for providing holes or electrons. The silicon substrate includes an added impurity having a concentration of less than $1 \times 10^{20}/cm^3$ for providing holes or electrons.

In the semiconductor element, the inclusion of chromium only in the interface between the silicon oxide film and the top electrode in the silicon oxide film in the vicinity of the interface provides for controlling the threshold voltage without substantially reducing the insulation property of the silicon substrate and without causing substantial adverse effect on the electrical characteristics of the silicon substrate.

A method of manufacturing a semiconductor element according to one aspect of the present invention includes the step of applying a heat treatment to a silicon substrate in the presence of chromium on a surface of the silicon substrate to form a silicon oxide film including chromium in the surface of the silicon substrate by thermal oxidation.

As an aspect of the method in the present invention, an inorganic solution which includes chromium or a chromium compound is brought into contact with the surface of the silicon substrate to cause chromium to be held on the silicon substrate. An organic solution which includes chromium or a chromium compound may be brought into contact with the surface of the silicon substrate to cause chromium to be held on the silicon substrate. The concentration of chromium or a chromium compound in the inorganic or organic solution is controlled so as to be 1000 ppm or less. The concentration of chromium or a chromium compound in the inorganic or organic solution is controlled so as to be in a range of 0.1 ppb–1000 ppm.

As another aspect of the present invention, the silicon substrate which includes chromium or a chromium compound on its surface is thermally oxidized at a temperature of less than 1150° C. At least one insertion of the silicon substrate into a thermally oxidizing heat treatment device and the temperature rise of the silicon substrate at the thermal oxidization is performed in an oxidizing atmosphere. The insertion of the silicon substrate into the thermally oxidizing heat treatment device is performed at a temperature of less than 1150° C. and at a speed of 10 mm/min. or more. Preferably, the heat treatment device is a rapid temperature-rising furnace.

According to the above method of the present invention, by presenting beforehand chromium or a chromium compound on the surface of the silicon substrate, chromium is taken into the silicon oxide film only at the interface between the silicon oxide film and its top electrode and in the vicinity of the interface at the thermal oxidization.

A semiconductor element is provided in which the threshold voltage can be controlled without substantially reducing the insulation property of the silicon oxide film and without substantially causing adverse effect on the electrical characteristics of the silicon substrate, by applying the thermal oxidation to the silicon substrate having chromium and the chromium compound on its surface at a temperature below 1150° C.

A method of manufacturing a semiconductor element according to another aspect of the present invention includes the steps of applying a heat treatment to a silicon substrate in an atmosphere which includes chromium to form, by thermal oxidization, a silicon oxide film which includes chromium on the surface of the silicon substrate.

As an aspect of the above method in the present invention, at least one temperature-rise of the silicon substrate in the thermal oxidization and the insertion of the silicon substrate into a thermally oxidizing heat treatment device for the thermal oxidization is performed in an oxygen atmosphere. After formation of a silicon oxide film having a thickness of more than 20 Å on the silicon substrate, the same is thermally oxidized in an atmosphere which includes chromium or a chromium oxide.

According to the above method of the present invention, thermal oxidation of the silicon substrate in an atmosphere which contains a chromium component or a chromium oxide component causes chromium to be deposited in the silicon oxide film only at the interface between the silicon oxide film and the top electrode and in the vicinity of the interface such that chromium gives no adverse affects on the concentration distribution of impurities in the silicon substrate.

A method of manufacturing a semiconductor element according to a further aspect of the present invention includes the steps of forming a silicon oxide film on one surface of a silicon substrate and applying a heat treatment to the silicon substrate, on which the silicon oxide film is formed, in the presence of chromium on the surface of the silicon oxide film to cause chromium to be included in the silicon oxide film.

In an aspect of the method in the present invention, the heat treatment is performed in an atmosphere which includes oxygen having a concentration larger than 0% and less than 6%.

According to the above method of the present invention, by presenting beforehand chromium or a chromium compound on the surface of the silicon substrate, chromium is absorbed into the silicon oxide film during the heat treatment. Thus, a MOS transistor is obtained whose threshold voltage is controlled without substantially reducing the insulation property of the silicon oxide film and without substantially causing adverse effects on the electrical characteristics of the silicon substrate.

A method of manufacturing a semiconductor element according to a further aspect of the present invention includes the steps of forming a silicon oxide film on one surface of a silicon substrate, ion implanting chromium or a chromium oxide into the surface of the silicon substrate, applying a heat treatment to the silicon substrate with the ion-implanted silicon oxide film to cause the chromium to be included into the surface of the silicon oxide film.

As a preferable aspect of the above method of the present invention, the heat treatment atmosphere includes oxygen having a concentration in a range of 2–7% inclusive. The heat treatment is performed at a temperature in a range of 600°–1000° C. inclusive. The heat treatment is performed for a time of less than 650 minutes and not less than 5 minutes.

According to the method of the present invention, chromium ions or chromium oxide ions are introduced into the silicon oxide film by ion implantation, and heat treatment is conducted such that chromium is taken into the chromium oxide film. Thus, a semiconductor element is obtained whose threshold voltage is controlled without substantially reducing the insulation property of the silicon oxide film and without substantially causing adverse effects on the electrical characteristics of the silicon substrate.

BRIEF DESCRIPTION OF THE DRAWINGS

FIG. 8 is a graph of a temperature profile at each of the steps of heat treatment applied in the method of the present invention.

FIGS. 11A and 11B are a cross-sectional view and a plan view, respectively, of a MOS transistor and a parasitic MOS transistor according to a further embodiment of the present invention.

FIG. 13 shows temperature profiles at the respective steps of the heat treatment of the method of the present invention.

FIG. 19 is a table of the relation between the proportion of a chromium-including region in the thickness of the silicon oxide film and an adverse affect on the dielectric breakdown voltage of the silicon oxide film in the embodiment of FIG. 1.

FIG. 20 is a table of the relation between the kind of the solution which includes chromium coated on a surface of a silicon substrate and the controllability of the threshold voltage, the dielectric breakdown voltage of the silicon oxide film, and the influence exerted on the lifetime of minority carriers in the substrate.

FIG. 21 is a table of the relation between the kind of a chromium-including solution in which the silicon substrate is dipped and the controllability of the threshold voltage, the dielectric breakdown voltage of the silicon oxide film and the influence exerted on the lifetime of minority carriers in the substrate.

FIG. 22 shows the influence of the temperature and the speed at which the silicon substrate is inserted into the heat treatment furnace in the heat treatment of the silicon substrate on the threshold voltage of the MOS transistor.

FIG. 23 is a table of the relation between a thermal oxidizing temperature and the change in the impurity concentration of the silicon substrate and the change in the threshold voltage with a parameter of the initial oxide film thickness in the heat treatment of the silicon substrate.

FIG. 24 is a table of the relation between a heat treatment temperature, and influence on a change in the impurity concentration in the substrate and the controllability of the threshold voltage when the silicon oxide film is coated with a chromium including solution and then heat treated.

FIG. 25 is a table of the relation between the concentration of oxygen in the atmosphere and the change in the thickness of the silicon oxide film and the controllability of the threshold voltage when the silicon oxide film is coated with a chromium including solution and then heat treated.

FIG. 26 is a table of the relation between the concentration of oxygen in the atmosphere and the change in the thickness of the silicon oxide film and the controllability of the threshold voltage when chromium ions are implanted into the silicon oxide film and then heat treated.

FIG. 27 is a table of the relation between a heat treatment temperature and the influences exerted on the respective functions of the MOS transistor when chromium ions are implanted into the silicon oxide film and then heat treated.

FIG. 28 is a table of the relation between a heat treatment time and the influences exerted on the respective functions of the MOS transistor when chromium ions are implanted into the silicon oxide film and then heat treated.

DESCRIPTION OF THE PREFERRED EMBODIMENTS

A MOS transistor to which the present invention is applied will be described with respect to the accompanying drawings.

Figure 1:
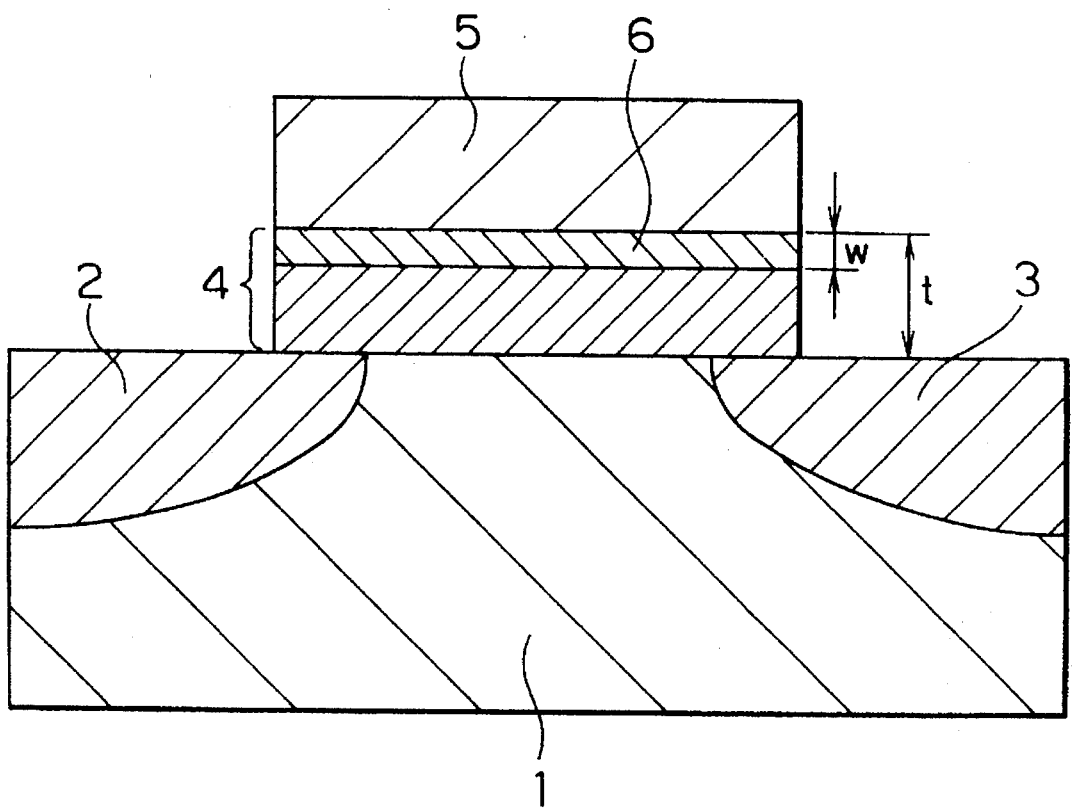
FIG. 1 is a cross-sectional view of a MOS transistor according to a first embodiment of the present invention.

FIG. 1 is a schematic cross-sectional view of a MOS transistor according to one embodiment of the present invention. Reference numeral 1 denotes a silicon substrate; 2 a source region of the MOS transistor; 3 a drain region of the MOS transistor; 4 a silicon oxide film of the MOS transistor; 5 a top electrode on the silicon oxide film; and 6 a region which includes chromium.

A table of FIG. 19 shows whether a change in the thickness w of a chromium-including region 6 relative to the thickness t of the silicon oxide film 4 in FIG. 1 adversely affects the dielectric breakdown voltage of the silicon oxide film 4 in comparison with a reference specimen in which no chromium is included intentionally in a silicon oxide film 4. As the thickness w of the chromium-including region 6 exceeds 75% of the thickness t of the silicon oxide film 4, an adverse effect appears, thereby lowering the reliability of the silicon oxide film 4.

The effect on the dielectric breakdown voltage of the silicon oxide film, as shown in the table, is determined on the basis of the result of measurement of the dielectric breakdown voltage. More particularly, the electric field strength is measured when a leakage current flowing through the oxide film reaches 1 μm/cm$^2$ while gradually increasing the voltage applied to the oxide film from 0 volts. When the measured field strength is higher than 8 MV/cm, a chip is determined to be good. A yield of the production with respect to the dielectric breakdown voltage of the oxide film is calculated on the basis of the number of chips which are determined to be good. When the yield is lower than that of reference specimens which includes no chromium added, it is determined that the dielectric breakdown voltage of the silicon oxide film is adversely affected.

Figure 2:
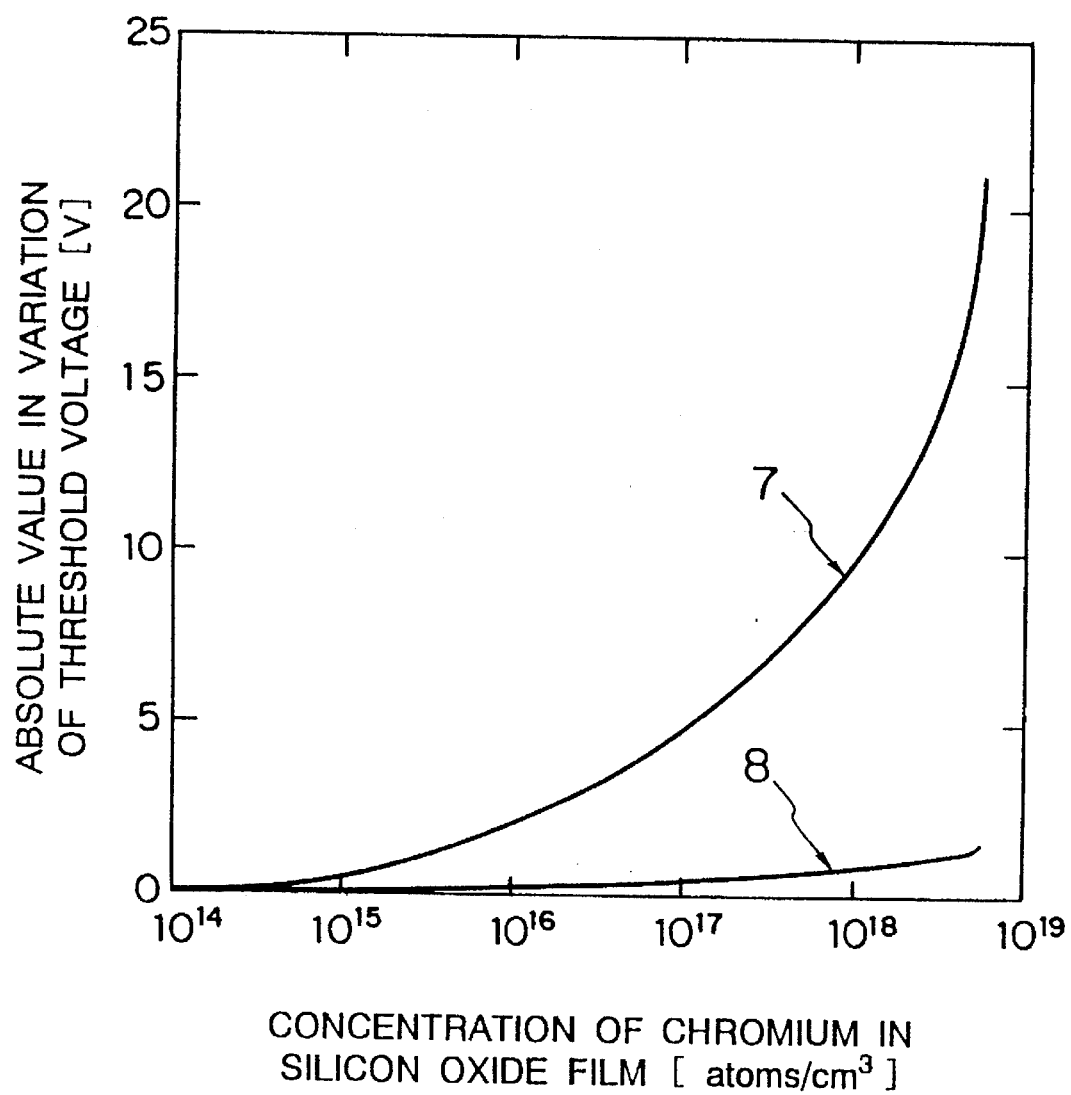
FIG. 2 is a graph of the relation between chromium content of the silicon oxide film of the transistor and its threshold voltage with the kind of an impurity added to a top electrode being a parameter.

FIG. 2 shows the relation between the threshold voltage and the chromium content of the region 6 of a MOS transistor formed on a silicon substrate 1 to which phosphorus is added as an impurity and which has a resistivity of 10 Ωcm as a parameter representing the kind of an impurity added to the top electrode 5 on the silk on oxide film 4 of FIG. 1. The abscissa of FIG. 2 indicates the concentration of chromium in the silicon oxide film 4, while the ordinate indicates an increase in the absolute value of a negative threshold voltage in comparison with a reference specimen in which no chromium is intentionally contained in a silicon oxide film 4. Reference numeral 7 denotes a change in the threshold voltage and the concentration of chromium in the silicon oxide film 4 when an impurity (hereinafter referred to as a donor), for example, phosphorus, arsenic or antimony, which supplies electrons is added to the top electrode 5 on the silicon oxide film 4. Reference numeral 8 denotes a change in the threshold voltage and the concentration of chromium in the silicon oxide film 4 when an impurity (hereinafter referred to as an acceptor), for example, boron, which supplies holes is added to the top electrode 5 on the silicon oxide film 4.

FIG. 2 shows that an increase in the chromium content of the silicon oxide film 4 (preferably, up to a concentration of more than 1×10$^{15}$/cm$^3$) changes the threshold voltage greatly. When an acceptor is added to the top electrode 5 on the silicon oxide film 4, a change in the threshold voltage is suppressed to a small value and the threshold voltage is finely controllable at a value of less than 1 V. In contrast, when a donor is added to the top electrode 5 on the silicon oxide film 4, the threshold voltage is greatly changed. Thus, by changing the chromium content of the region 6 of FIG. 1 and the kind of impurity added to the top electrode 5, the magnitude of the threshold voltage is readily selectable.

Figure 3:
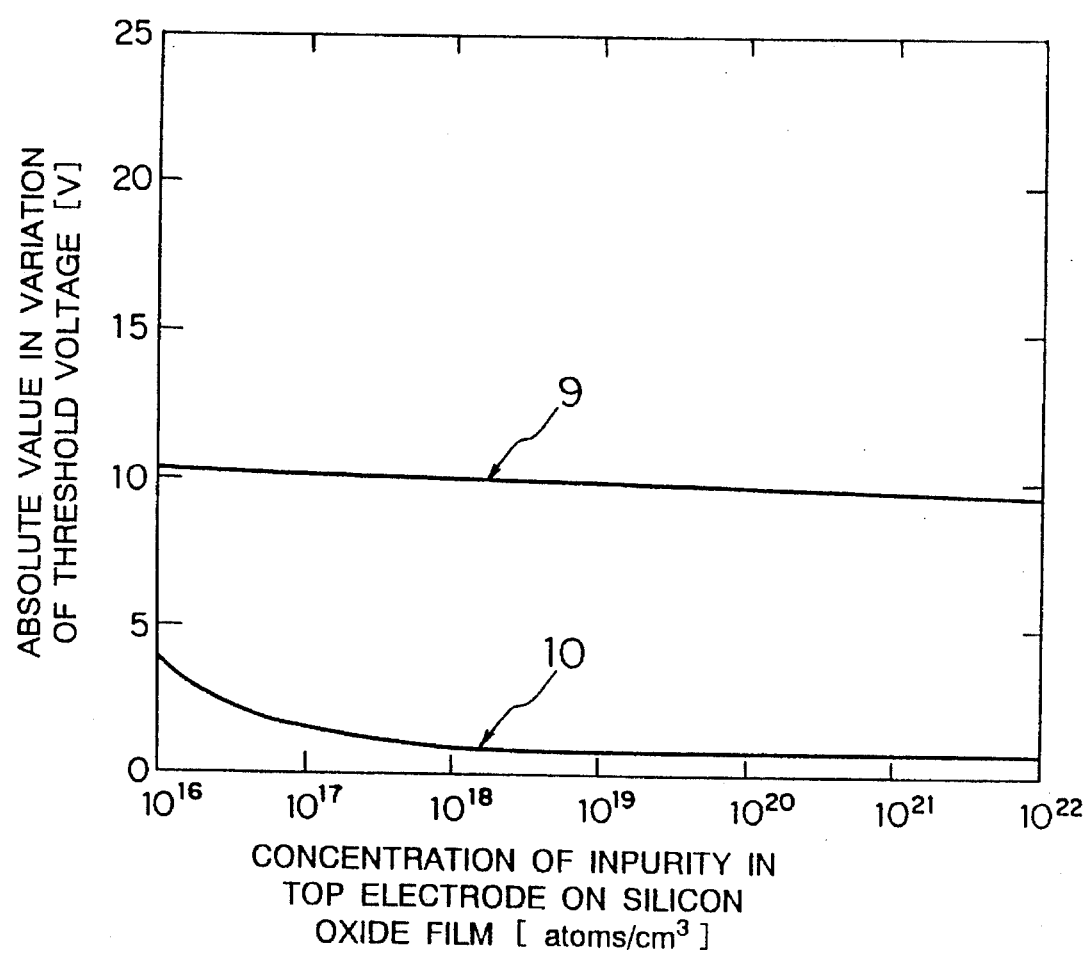
FIG. 3 is a graph of the relation between an impurity added to the top electrode and the threshold voltage when the chromium content of the silicon oxide film is constant.

FIG. 3 shows the relation between the threshold voltage and the concentration of an impurity added to the top electrode 5 when the chromium content of the area 6 in the MOS transistor formed on the silicon substrate 1 of FIG. 1 is, for example, 1×10$^{18}$/cm$^3$. The abscissa of FIG. 3 indicates the concentration of the impurity added to the top electrode 5, while the ordinate indicates an amount of increase in the absolute value of a negative threshold voltage in comparison with a reference specimen in which no chromium is intentionally contained in a silicon oxide film 4. Reference numeral 9 denotes the relationship between the threshold voltage and the concentration of an impurity including a donor added to and present in the top electrode 5. Reference numeral 10 denotes the relation between the absolute value of the threshold voltage and the concentration of an impurity in the top electrode 5 when an acceptor is added thereto.

FIG. 3 shows that when the impurity added to the top electrode 5 is a donor, a change of the threshold voltage is substantially constant and is not affected by the concentration of the impurity. When the impurity added to the top electrode 5 is an acceptor, a change of the threshold voltage increases as the concentration of the impurity decreases. Thus, by changing the concentration of the impurity (preferably, controlling the concentration in a range of less than 1×10$^{22}$/cm$^3$), the threshold voltage can be controlled irrespective of whether the impurity added to the top electrode 5 is a donor or an acceptor. In particular, if the impurity is an acceptor, it will be seen that the threshold voltage is greatly changed.

Figure 4:
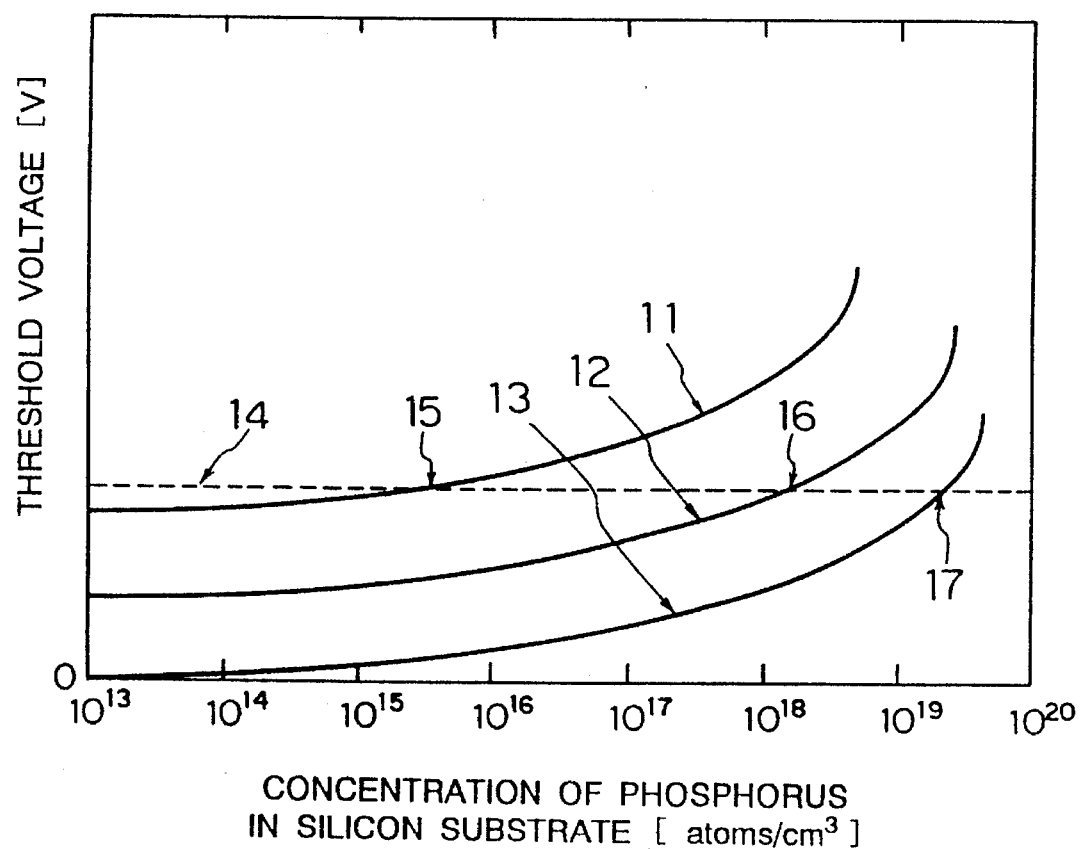
FIG. 4 is a graph of the relation between the concentration of an impurity in the silicon oxide film and the threshold voltage when the chromium content of the silicon oxide film and the concentration and kind of the impurity added to the top electrode are constant.

FIG. 4 shows the relation between the threshold voltage and the concentration of an impurity, for example, phosphorus, in the silicon substrate 1 of a MOS transistor in which the chromium content of the region 6 of FIG. 1 is 1×10$^{16}$/cm$^3$, or 3×10$^{16}$/cm$^3$ and phosphorus added to the top electrode 5 is 1×10$^{21}$/cm$^3$, along with a reference specimen where no chromium is intentionally contained in its silicon oxide film 4. The abscissa of FIG. 4 represents the concentration of phosphorus it the silicon substrate 1, while the ordinate represents an amount of change in the threshold voltage in absolute value. Reference numeral 11 denotes the relation between the threshold voltage and the concentration of phosphorus in the silicon substrate 1 when the chromium content is 3×10$^{16}$/cm$^3$. Reference numeral 12 denotes the relation between the threshold voltage and the concentration of phosphorus in the silicon substrate 1 when the chromium content is 1×10$^{16}$/cm$^3$. Reference numeral 13 denotes the relation between the threshold voltage and the concentration of phosphorus in the silicon substrate 1 of the reference specimen in which no chromium is intentionally contained in the silicon oxide film 4.

FIG. 4 indicates that in order to design a MOS transistor having a threshold voltage of a level 14 as shown in FIG. 4, there are three different phosphorus concentrations in the silicon substrate 1 represented by crossings 15, 16 and 17 of the broken line 14 with the respective curves 11, 12 and 13. Thus, the value of the impurity (in this case, phosphorus) concentration in the silicon substrate 1 is selectable from the three different phosphorus concentrations in correspondence to the chromium content of the region 6. Thus, when any desired threshold value is to be selected, the degree of freedom in selecting the concentration of an impurity (which is preferably controlled in a range of less than $1\times10^{20}/cm^3$) to be included in the silicon substrate 1 for control of the threshold voltage increases by addition of chromium to the silicon oxide film 4.

The present embodiment is very useful for a semiconductor integrated circuit of high integration density since the threshold voltage is controllable or the basis of a change in the flatband voltage without substantially reducing the insulation property of the silicon oxide film and without substantially causing adverse effect on the electrical characteristic of the silicon substrate.

A first embodiment of a method of manufacturing a MOS transistor of FIG. 1 will be described below which includes chromium in only a region of the silicon oxide film including the interface between the silicon oxide film and the top electrode on the silicon oxide film and in the vicinity of the interface.

In the first embodiment, the step of forming the silicon oxide film on one surface of the silicon substrate by thermal oxidation in the MOS transistor manufacturing method is carried out in the presence of chromium on the surface of the silicon substrate, thereby causing chromium to be included in the silicon oxide film.

When the surface of the silicon substrate 1 of FIG. 1 is coated with an inorganic or organic solution to which chromium having a concentration of 100 ppm is added and the silicon substrate 1 is then thermally oxidized to make a MOS transistor, a table of FIG. 20 shows whether each of various kinds of solution to which chromium is added is effective or not for changing the threshold voltage of the MOS transistor. The "very effective" in the table indicates that the threshold voltage is changed by more than 1 volt. The "effective" indicates that the threshold voltage is changed between 0.5 and 1 V. The "slightly effective" indicates that the threshold voltage is changed by less than 0.5 volts. The table also indicates other electrical characteristics of the MOS transistor, such as dielectric breakdown voltage of the silicon oxide film 4 and the influence of chromium on the lifetime in generation of minority carriers.

When a mixture of two or three different solutions is used, reduction of the dielectric breakdown voltage of the silicon oxide film 4 and/or reduction of the lifetime in generation of minority carriers can be recognized. The deterioration of those electrical characteristics derives from roughening of the silicon substrate surface due to coating of the mixture of solutions and differs from adverse effect by chromium itself. Thus, in that case, the process can be effectively used by controlling the concentration of the organic or inorganic solution to avoid such roughening of the silicon substrate surface.

When the silicon substrate 1 of FIG. 1 is dipped in either an inorganic or an organic solution to which chromium having a concentration of 100 ppm is added and the silicon substrate 1 is then thermally oxidized to make a MOS transistor, a table of FIG. 21 shows whether each of various kinds of solutions to which chromium is added is effective or not for changing the threshold voltage of the MOS transistor. The "very effective" in the table of FIG. 21 indicates that the threshold voltage is changed by more than 1 volt. The "effective" indicates that the threshold voltage is changed between 0.5 and 1 V. The "slightly effective" indicates that the threshold voltage is changed by less than 0.5 volts. The table of FIG. 21 also indicates other electrical characteristics of the MOS transistor, such as the dielectric breakdown voltage of the silicon oxide film 4 and the influence of chromium on the lifetime in generation of the minority carriers.

When a mixture of two or three different solutions is used, reduction of the dielectric breakdown voltage of the silicon oxide film 4 and/or reduction of the lifetime in generation of minority carriers can be recognized. The deterioration of those electrical characteristics derives from roughening of the silicon substrate surface due to dipping in the mixture of solutions and differs from adverse effect by chromium itself. Thus, also in that case, the process can be effectively used by controlling the concentration of the organic or inorganic solution to avoid such roughening of the silicon substrate surface.

It will be seen from the tables of FIGS. 20 and 21 that control of the threshold voltage by presenting chromium on the surface of the silicon substrate 1 before the thermal oxidation does not depend on how to bring chromium into contact with the surface of the silicon substrate 1.

The determination of the influence on the dielectric breakdown voltage of the silicon oxide film in the tables of FIGS. 20 and 21 is based on the same criterions as those described with respect to the table of FIG. 19. The effect of chromium on the lifetime in generation of the minority carriers is determined as (1) "not adversely affected" when the lifetime with addition of chromium is at the same level as that of a reference specimen to which no chromium is added; (2) "adversely affected" when more than 50% of the lifetime is reduced; and (3) "somewhat affected" when less than 50% of the lifetime is reduced.

Figure 5:
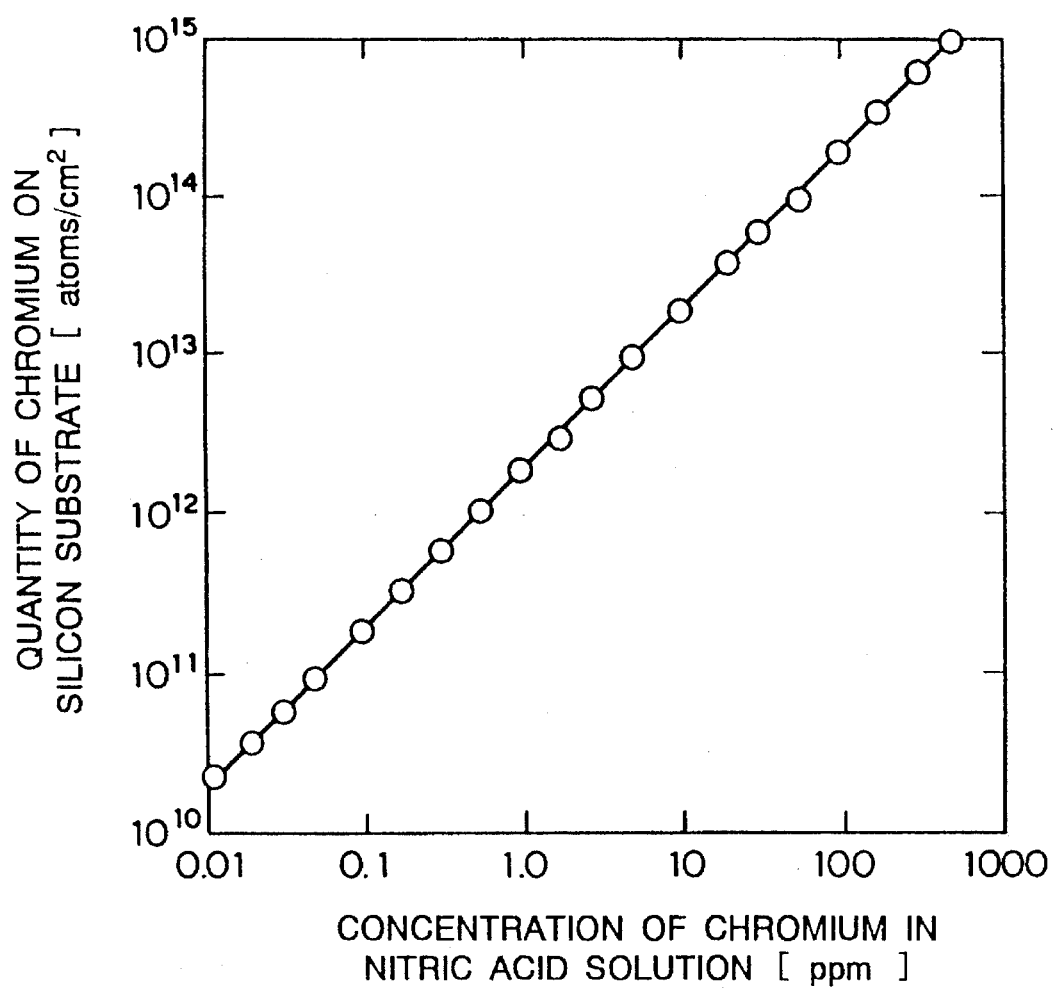
FIG. 5 is a graph of the relation between the concentration of chromium in a chromium-added nitric acid solution as coated on a silicon substrate and a quantity of chromium diffused in the surface of the silicon substrate.

FIG. 5 shows the relation between the concentration of chromium added to, for example, a nitric acid solution, which is coated on a surface of the silicon substrate 1 before thermal oxidation thereof and the quantity of chromium present on the surface of the silicon substrate 1 after coating. The abscissa represents the concentration of chromium in the nitric acid solution, and the ordinate represents a quantity of chromium per unit area on the surface of the silicon substrate 1 after the coating of chromium.

FIG. 5 also indicates that an increase in the concentration of chromium in the nitric acid in a range of 0.01–1000 ppm causes an increase in the quantity of chromium per unit area on the surface of the silicon substrate 1. Since the concentration of chromium in the nitric acid solution and the quantity of chromium per unit are on the surface of the silicon substrate 1 are in a simple proportional relation, it is seen that the quantity of chromium can be present on the surface of the silicon substrate 1 before the thermal oxidation is selectable. When the concentration of chromium it the nitric acid solution is less than 0.01 ppm, the quantity of chromium per unit area on the surface of the silicon substrate 1 is greatly unstable so that it cannot be used practically.

Figure 6:
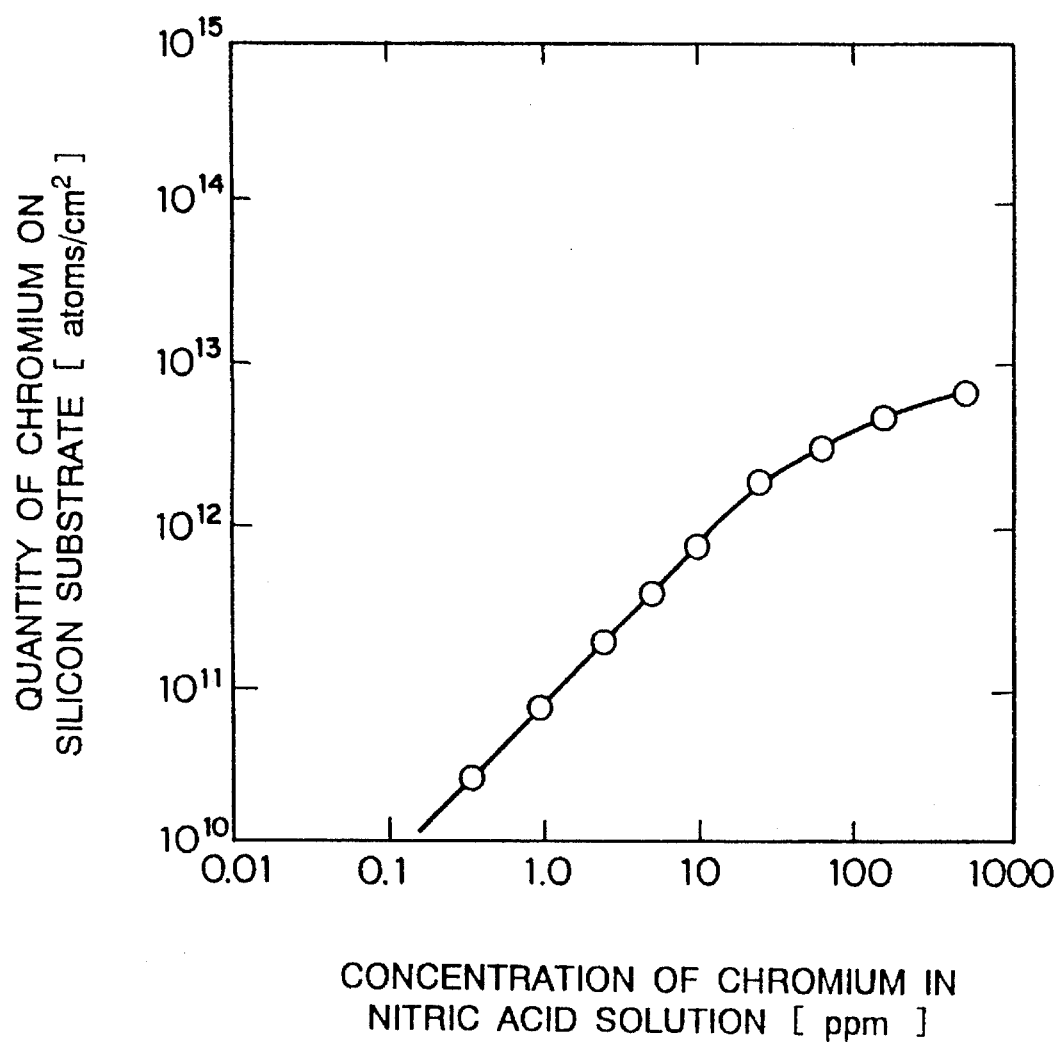
FIG. 6 is a graph of the relation between the concentration of chromium in a chromium-added nitric acid solution in which the silicon substrate is dipped and a quantity of chromium diffused in the surface of the silicon substrate.

FIG. 6 shows the relation between the concentration of chromium added to, for example, a nitric acid solution, in which the silicon substrate 1 is dipped before thermal oxidation thereof, and the quantity of chromium present on the surface of the silicon substrate 1 after dipped for more than 30 seconds and left to natural drying for 30 minutes. The abscissa represents the concentration of chromium in the nitric acid solution and the ordinate represents a quantity of chromium per unit area on the surface of the silicon substrate 1 after dipped in the nitric acid solution. It is to be noted that if the time for which the silicon substrate is dipped in the nitric acid solution exceeds 30 seconds, the density of chromium remaining on the substrate surface is unchanged.

FIG. 6 also shows that an increase in the concentration of chromium in the nitric acid in a range of 0–1000 ppm brings about an increase in the quantity of chromium per unit area on the surface of the silicon substrate 1. The concentration of chromium in the nitric acid solution and the quantity of chromium per unit area on the surface of the silicon substrate 1 are in a one-to-one relation.

As described above, according to the present embodiment, chromium is effectively included in the silicon oxide film. Thus, a MOS transistor whose threshold voltage is controllable is easily made without substantially reducing the insulation property of the silicon oxide film and substantially causing adverse effect on the electrical characteristics of the silicon substrate. Thus, the invention is very useful for a semiconductor integrated circuit of high integration density.

A method of manufacturing the MOS transistor of this embodiment will be described with respect to FIGS. 7A–7E.

Figure 7A:
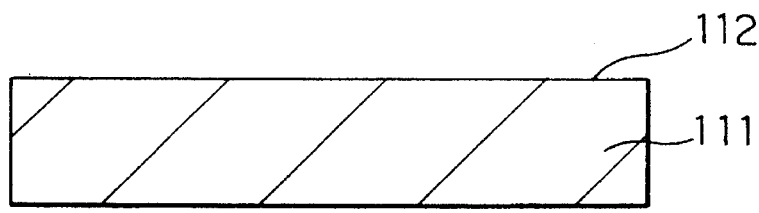
FIGS. 7A to 7E cross-sectional views of semi-products of a MOS transistor in the respective steps of a method of manufacturing the MOS transistor according to the embodiment of the present invention.

First, as shown in FIG. 7A, a surface of an n-type silicon substrate 111 which includes phosphorus as an impurity at a concentration of $4 \times 10^{14}$ atoms/cm$^3$ is cleaned and then coated by spin coating with a nitric acid solution, for example, including a chromium component. A quantity of chromium component as coated is on the order of $2 \times 10^{10} - 5 \times 10^{14}$ atoms/cm$^2$ which is less than a surface density of silicon atoms (on the order of $2 \times 10^{15}$ atoms/cm$^2$) exposed on the surface of the silicon substrate 111. Thus, an invisible chromium component layer 112 corresponding to a 0.25–0.0001 atom layer is formed on the surface of the substrate 111. The chromium component layer 112 may be formed by dipping.

Figure 7B:
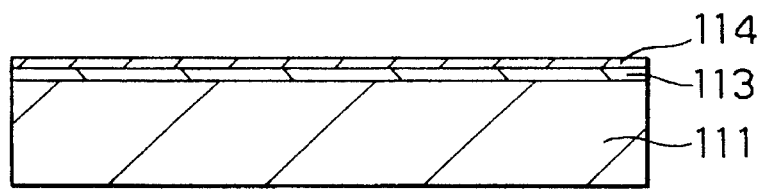

As shown in FIG. 7B, the silicon substrate 111 having the chromium component layer 112 on the surface thereof is then inserted into a heat treatment furnace for oxidizing purposes to form a silicon oxide film 113 having a chromium-including area 114. At this time, the temperature profile in the heat treatment furnace is shown in FIG. 8. By optimizing the temperature $T_1$, an insertion speed and an atmosphere A in the oxidizing process of the silicon substrate 111; a temperature rising rate and an atmosphere B in the temperature rising process; and a temperature $T_2$ and an atmosphere C in the thermal oxidation process, a region 114 which includes chromium is formed only in the vicinity of the surface of the silicon oxide film 113. Usually, the atmospheres A and B are each a non-oxidizing one, for example, of argon or nitrogen, while the atmosphere C is an oxidizing gas.

Figure 7C:
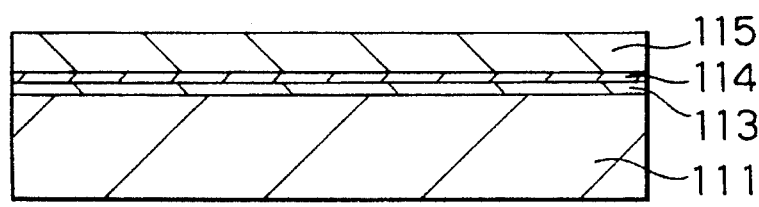

As shown in FIG. 7C, a polycrystalline silicon film 115 is deposited by LPCVD method, and an impurity is introduced into the polycrystalline silicon film 115, for example, by ion implantation so as to provide electric conductivity.

Figure 7D:
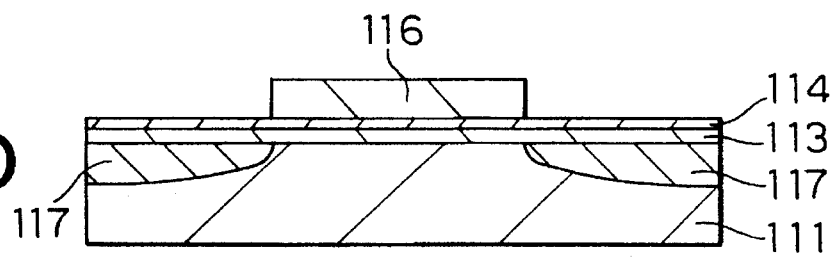

As shown in FIG. 7D, the polycrystalline silicon film 115 is patterned by photolithography and dry etching to form a gate electrode 116. A P-type impurity such as B$^+$ or BF$^{2+}$ is ion implanted by using the gate electrode 116d as a mask to form low concentration impurity diffusion layers 117.

Figure 7E:
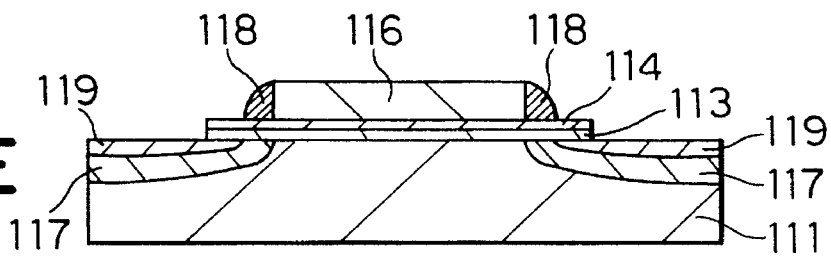

As shown in FIG. 7E, a silicon oxide film is deposited by LPCVD method. Sidewall oxide films 118 are then formed with etching-back by dry etching. A p-type impurity such as B$^+$ or BF$^{2+}$ is implanted by ion implantation by using the gate electrode 116 and sidewall oxide films 118 as a mask. Heat treatment is then performed to form high concentration impurity layers 119.

Figure 9:
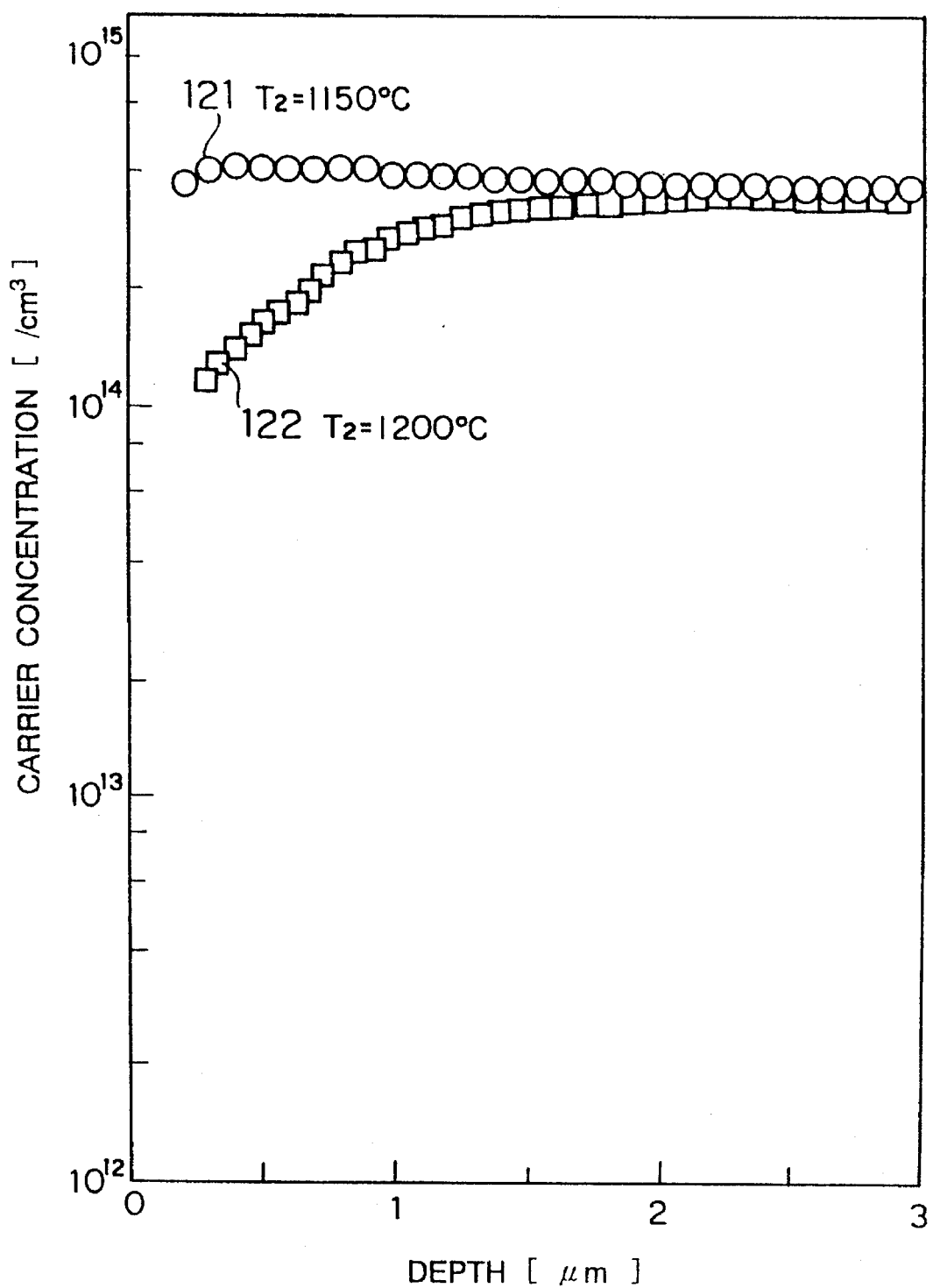
FIG. 9 is a graph of distribution of a carrier concentration in the depth direction in the substrate with a parameter of the temperature at which the silicon substrate having chromium in its surface is subjected to thermal oxidation.

FIG. 9 shows a distribution of electron or hole carrier concentration in the depth direction in the silicon substrate with a parameter of temperature $T_2$ at which the silicon substrate having chromium on its surface is thermally oxidized. In this case, phosphorus is added at a concentration on the order of $4 \times 10^{14}$ atoms/cm$^3$ as an impurity to the silicon substrate, and chromium is coated at a surface density on the order of $2 \times 10^{14}$ atoms/cm$^2$ on the surface of the silicon substrate.

In FIGS. 9, reference numeral 121 denotes its profile plotted when the thermal oxidization temperature $T_2$ is 1150° C. and reference numeral 122 denotes its profile plotted when the temperature $T_2$ is 1200° C. When the temperature $T_2$ is 1150° C., the carrier concentration in the silicon substrate is constant through the thickness of the silicon substrate, and no chromium is diffused in the silicon substrate. When the thermal oxidizing temperature $T_2$ is 1200° C., the carrier concentration in the silicon substrate decreases toward its surface. This indicates that chromium diffused in the silicon substrate acts as an acceptor impurity to cancel the action of phosphorus as the donor impurity, and chromium is diffused in the silicon substrate.

Thus, in order to prevent diffusion of chromium in the silicon substrate during thermal oxidation, the thermal oxidization temperature $T_2$ is required to be lower than 1150° C.

Figure 10:
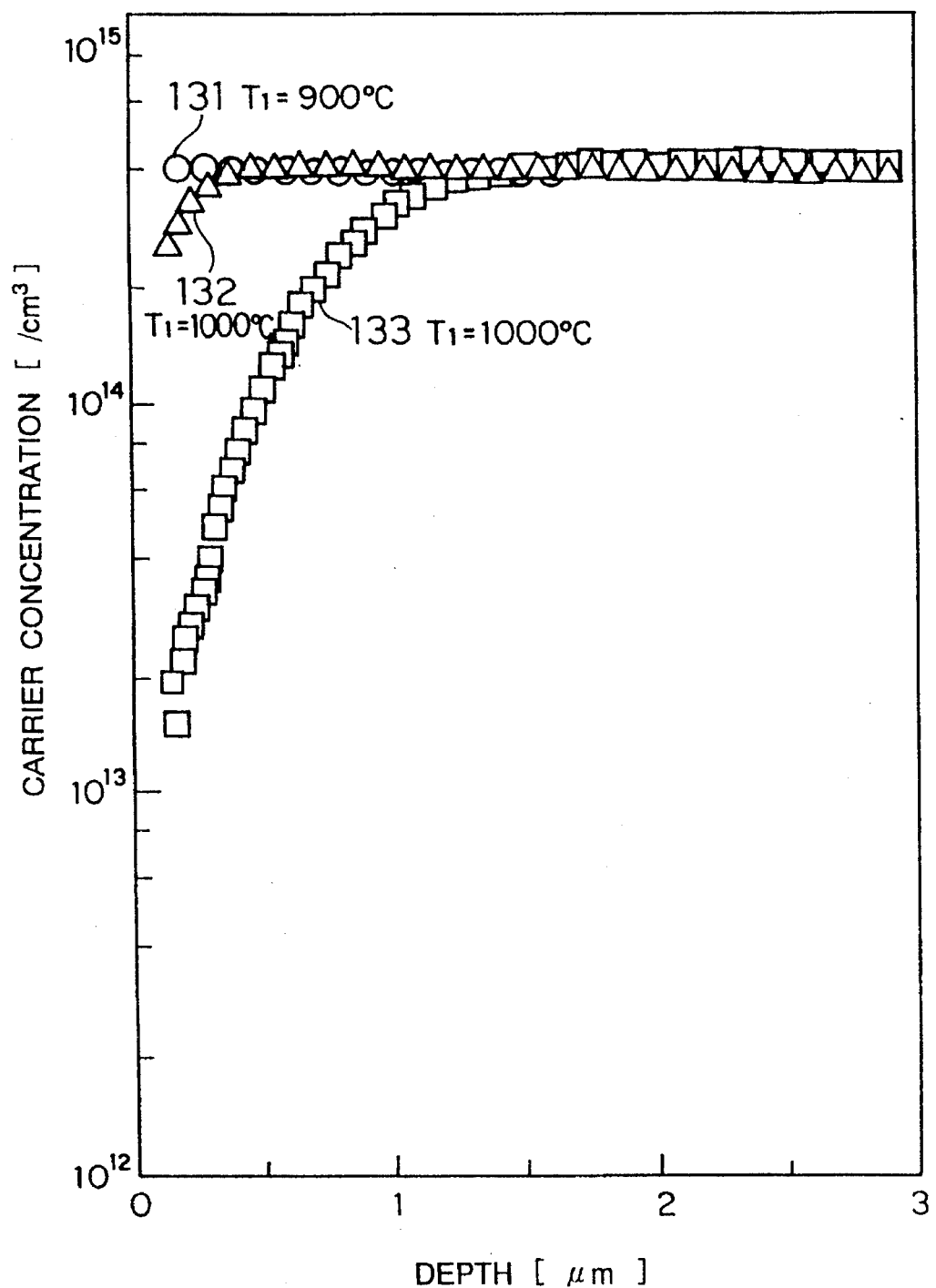
FIG. 10 shows a distribution of carrier concentration in the depth direction in the substrate when the substrate is thermally oxidized at a temperature of 1150° C. with a parameter of the temperature at which the silicon substrate with chromium on its surface is inserted into a heat treatment furnace.

FIG. 10 shows a distribution of the carrier concentration in the depth direction in a silicon substrate having chromium on its surface obtained when the same is subjected to thermal oxidization at 1150° C. with a parameter of temperature $T_1$ at which the silicon substrate having chromium on its surface is inserted into the heat treatment furnace. Phosphorus is added as an impurity at a concentration on the order of $4 \times 10^{14}$ atoms/cm$^3$ into the silicon substrate, and chromium is coated thereon at a density of $6 \times 10^{12}$ atoms/cm$^2$. The atmosphere A in the heat treatment furnace in which the silicon substrate is inserted is a non-oxidizing one, and the inserting speed is 100 mm/minute.

In FIG. 10, reference numeral 131 denotes its profile plotted when the insertion temperature $T_1$ is 900° C.; reference numeral 132 denotes its profile plotted when the insertion temperature $T_1$ is 1000° C.; and reference numeral 133 denotes its profile plotted when the temperature $T_1$ is 1100° C. When the temperature $T_1$ is 900° or 1000° C., the carrier concentration in the silicon substrate is substantially constant irrespective of depth in the silicon substrate, and no chromium is diffused in the silicon substrate. When the temperature $T^1$ is 1100° C., the carrier concentration in the silicon substrate decreases toward its surface. Thus, chromium is diffused in the silicon substrate.

The above embodiment is for the case where the atmosphere A in the heat treatment furnace in which the silicon substrate is inserted is a non-oxidizing one. When the atmosphere A in the heat treatment furnace in which the silicon substrate is inserted and the atmosphere B used at the temperature rising are each 10% oxidizing atmosphere, the carrier concentration in the silicon substrate is constant irrespective of depth in the silicon substrate as shown by the plot 131 in FIG. 10 even when the temperature $T_1$ at insertion increases to 1150° C.

That is, it will be seen that when the silicon substrate is inserted into the non-oxidizing atmosphere in the heat treatment furnace, the insertion temperature $T_1$ is required to be less than 1,100° C. in order to prevent the diffusion of chromium into the silicon substrate. However, when the silicon substrate is inserted into the non-oxidizing atmosphere of the heat treatment furnace, there is no problem even when the temperature $T_1$ at insertion is 1150° C.

A table of FIG. 22 shows the influence of the temperature $T_1$ and the speed at insertion of the silicon substrate having chromium on its surface, into the heat treatment furnace for thermal oxidation on the carrier concentration in the silicon substrate of a MOS transistor. In the table, when a change of the carrier concentration appears in the vicinity of the surface of the substrate, as compared with a reference specimen which includes no chromium in its silicon oxide film, it is determined that there is a change. Phosphorus is added as an impurity at a concentration on the order of $4 \times 10^{14}$ atoms/cm$^3$ to the silicon substrate, and chromium is coated at a density of $6 \times 10^{12}$ atoms/cm$^2$.

When the temperature $T_1$ at insertion is lower than 800° C., no adverse effect appears even if the insertion speed decreases to less than 10 mm/min. temperature $T_1$ at insertion is 900° C., an adverse effect appears if the insertion speed is less than 10 mm/min.; when the temperature $T_1$ at insertion is 1000° C., an adverse effect appears if the insertion speed is less than 40 mm/min.; when the temperature $T_1$ at insertion is 1100° C., an adverse effect appears if the insertion speed is less than 70 mm/min.; and when the temperature $T_1$ at insertion is 1150° C., an adverse effect appears if the insertion speed is less than 90 mm/min.

Thus, when the silicon substrate is oxidized at a temperature of less than 1150° C., the speed at which the silicon substrate is inserted into the heat treatment furnace is required to be higher than 100 mm/min., in order to eliminate an adverse effect of chromium on the silicon substrate, irrespective of the temperature $T_1$ at insertion.

In order to eliminate an adverse effect of chromium on the silicon substrate, a rapidly temperature-rising lamp type annealing furnace which uses a halogen or xenon light source may be used as the heat treatment furnace.

In the above embodiment, the impurity added to the silicon substrate is not limited to phosphorus, but another impurity such as boron, arsenic or antimony may be used. The chromium presented on the silicon substrate may be, for example, a chromium compound such as a chromium oxide including CrO, $Cr_2O_2$ or $CrO_3$. The present embodiment is applicable to a gate oxide film of a MOS transistor provided in a memory cell of a DRAM, a tunnel oxide film used in a flash memory, and a gate insulating film of a thin film transistor (TFT). It is also applicable to a field transistor provided in an element isolating region and SOI element. The gate oxide film of a MOS transistor may be a lamination structure of a silicon oxide film and a silicon nitride film such as an ONO film.

Another embodiment of the method of manufacturing a semiconductor element according to the present invention will be described below with reference to FIGS. 11A, 11B and 12A–12E. FIG. 11A is a schematic cross-sectional view taken along the line A—A of FIG. 11B, which is a plan view of a pattern of a MOS transistor of the present embodiment and a parasitic MOS transistor.

In FIGS. 11A, 11B, a silicon substrate 211 has an element isolating oxide film 220 formed by LOCOS method and a MOS transistor $T_1$, which drives an LSI, formed in the element area isolated by the element isolating oxide film 220. The MOS transistor $T_1$ has a silicon oxide film 212, as a gate oxide film, which has a chromium component-including region 213. A threshold voltage is set at a selected value by the chromium component including region 213.

The gate electrode of the MOS transistor $T_1$ is composed of a polycrystalline silicon layer 215, which provides a parasitic MOS transistor $T_2$ on the element isolating oxide film 220. In order to adjust the threshold voltage of the parasitic MOS transistor $T_2$, a chromium component-including region 219 is formed on the element isolating oxide film 220, so that the chromium component-including region 219 prevents the parasitic MOS transistor $T_2$ from turning on to ensure the proper element isolation when a predetermined voltage is applied to the polycrystalline silicon 215 for driving the MOS transistor $T_1$.

The method of manufacturing the MOS transistor according to this embodiment will be described next with respect to FIGS. 12A–12E. Since the transistors $T_1$ and $T_2$ are manufactured in the same manner, only the method of manufacturing the transistor $T_1$ will be described below.

Figure 12A:
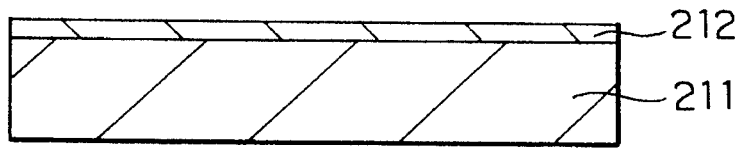
FIGS. 12A to 12E are cross-sectional views of semi-products of a MOS transistor in the respective steps of a method of manufacturing the MOS transistor according to the further embodiment of the present invention.

As shown in FIG. 12A, a surface of an n-type silicon substrate 211 which includes phosphorus as an impurity at a concentration on the order of $4 \times 10^{14}$ atoms/cm$^3$ is cleaned. The silicon substrate 211, thus obtained, is then inserted into a heat treatment furnace, such as a vertical diffusion furnace, for oxidizing purposes to form a silicon oxide film 212 having a thickness, for example, on the order of 100 Å. At this time, the temperature profile in the heat treatment furnace is shown in FIG. 13. When the silicon substrate 211 is inserted into the furnace, the temperature $T_1$ is set to 800° C., the insertion speed is set to 200 mm/min., and the atmosphere A is an oxidizing atmosphere which contains at least oxygen or steam. The temperature-rising rate is 5° C./min., the atmosphere B is an oxidizing one; the thermal oxidation temperature $T_2$ is 1000° C. and the thermally oxidizing atmosphere C is a mixture of 99.999% or more of a water vapor and oxygen.

Figure 12B:
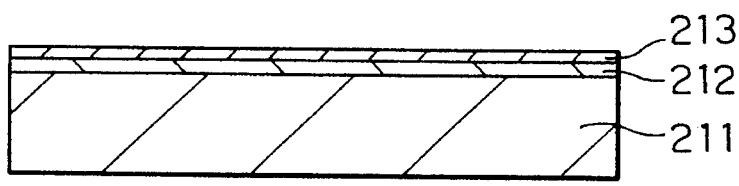

Next, as shown in FIG. 12B, the oxygen of the thermally oxidizing atmosphere C is replaced with oxygen containing a chromium component such as $CrO_3$, $CrO_4^{2-}$ or $Cr_2O_4^{2-}$. This new atmosphere is referred to as an atmosphere D. Thus, oxygen molecules diffuse in the silicon oxide film 212 to react with the silicon substrate 211 to form a new silicon oxide film between the silicon oxide film 212 and silicon substrate 211 to thicken the silicon oxide film 212. The diffusion coefficient of the chromium component into the silicon oxide film 212 is smaller by few figures than that of the oxygen molecules. Thus, the chromium component does not reach the silicon substrate 211, so that a silicon oxide film region 213 is formed which includes chromium only in the vicinity of the surface of the silicon oxide film 212.

Figure 12C:
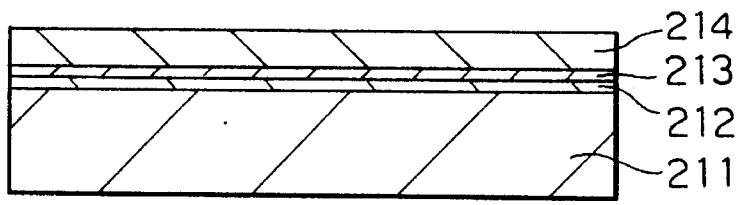

As shown in FIG. 12C, a polycrystalline silicon film 214 is deposited by LPCVD method and an impurity is introduced into the polycrystalline silicon film 214 by ion implantation to provide electrical conductivity.

Figure 12D:
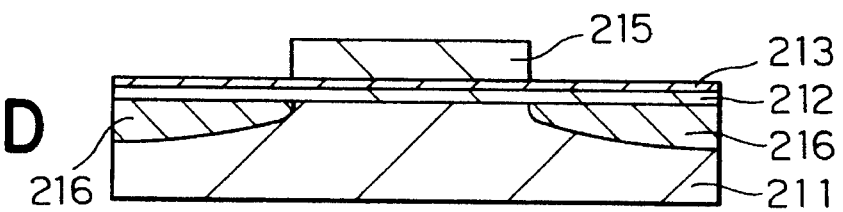

As shown in FIG. 12D, the polycrystalline silicon film 214 is patterned by photolithography and dry etching to form a gate electrode 215, anti a p-type impurity such as B+ or BF2+ is implanted by using the gate electrode 215 as a mask to form low concentration impurity diffusion layers 216.

Figure 12E:
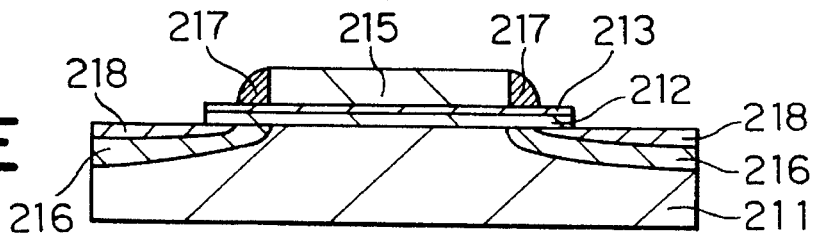

As shown in FIG. 12E, a silicon oxide film is deposited by LPCVD method. Sidewall oxide films 217 are then formed with etching-back by dry etching. A p-type impurity such as B+ or $BF^{2+}$ is implanted by ion implantation by using the gate electrode 215 and sidewall oxide films 217 as a mask. Heat treatment is then applied to form high concentration impurity diffusion layers 218.

Figure 14:
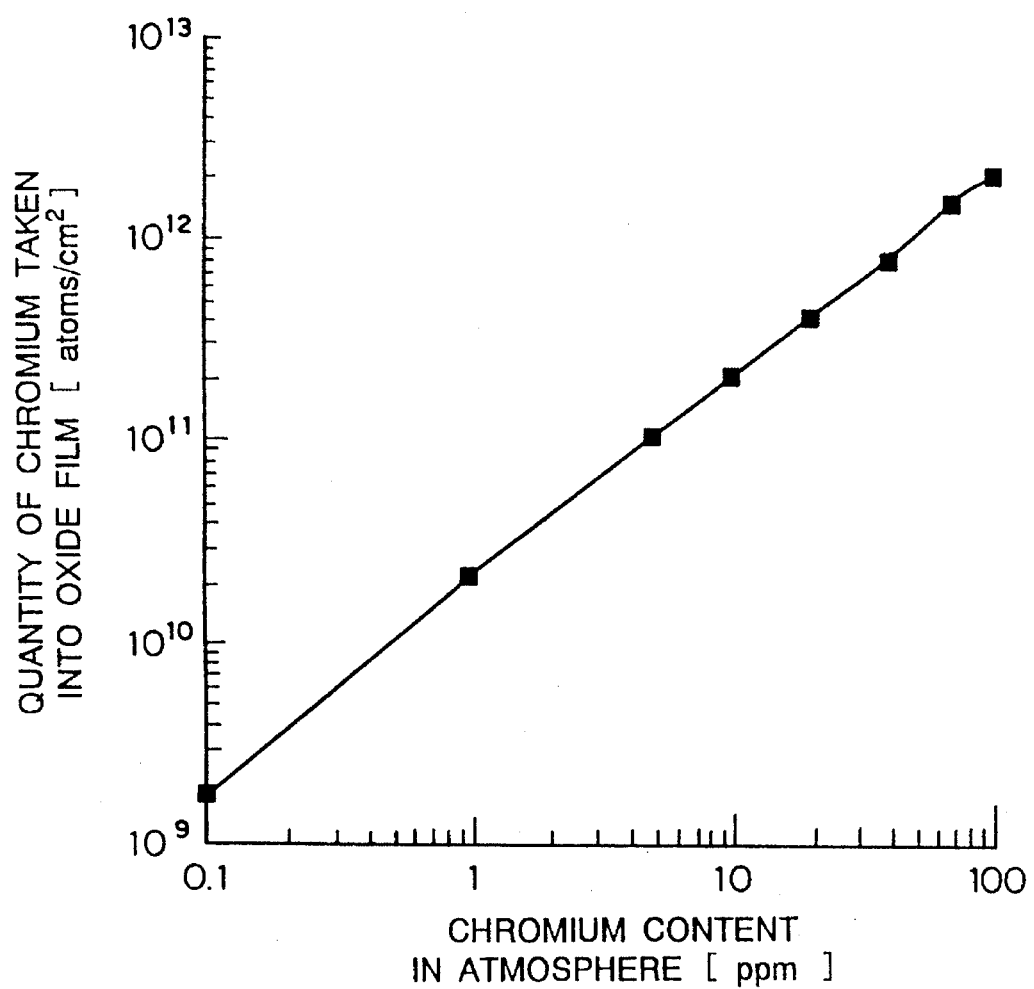
FIG. 14 shows the relation between chromium content and quantity of chromium taken into a silicon oxide film when the silicon substrate is the thermally oxidized in an atmosphere which includes chromium.

FIG. 14 shows the relation between the chromium content of a chromium-including atmosphere in which the silicon substrate is thermally oxidized an the chromium content taken into the silicon oxide film. In this case, the silicon substrate is thermally oxidized at 1000° C. The ordinate represents an quantity of chromium taken into a unit surface area of the oxide film having a 300 Å thick.

In FIG. 14, since the quantity of chromium taken into the silicon oxide film is directly proportional to the chromium content of the atmosphere, the quantity of chromium in the silicon oxide film is controllable in accordance with the chromium content in the atmosphere used during the thermal oxidation.

Figure 15:
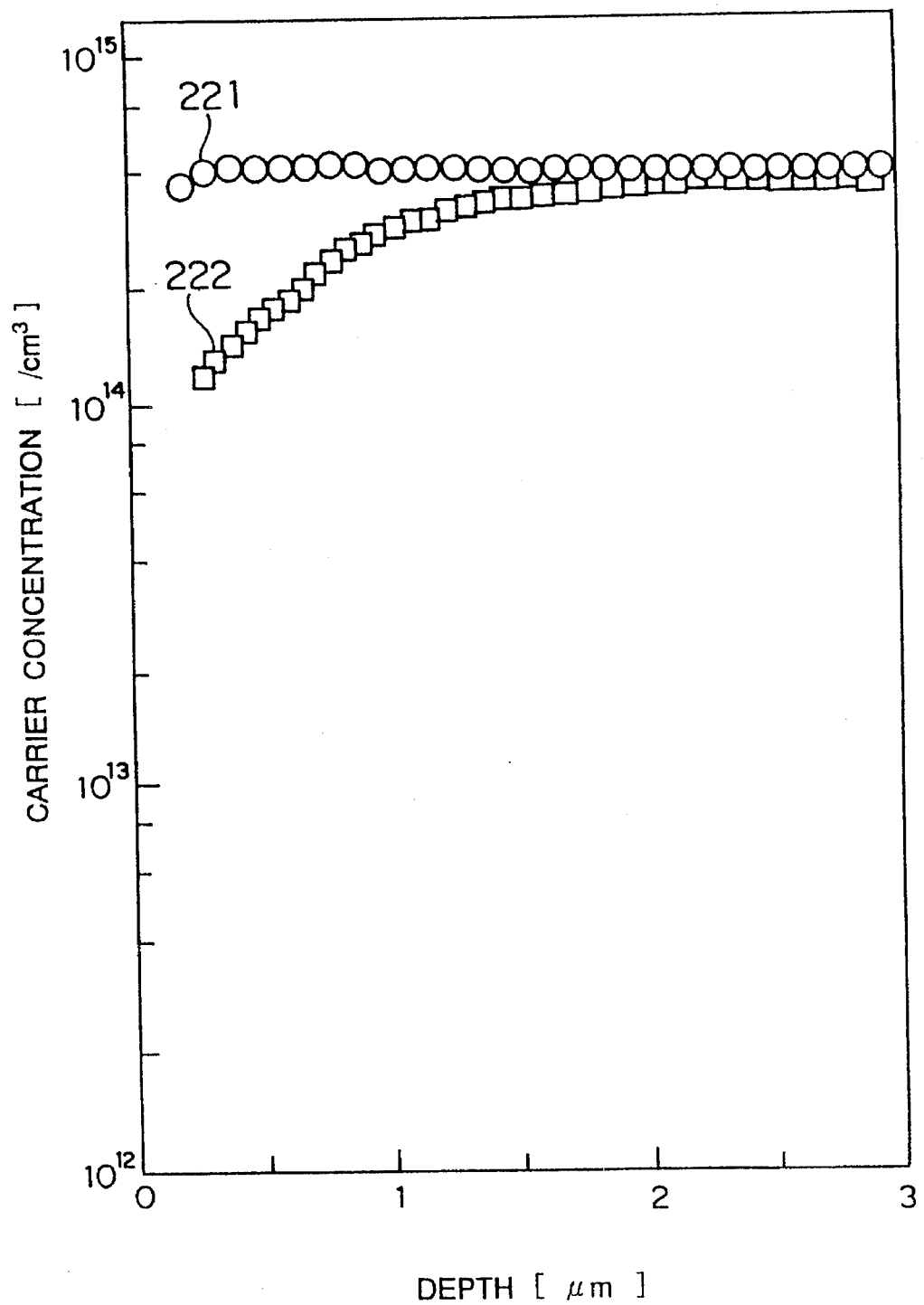
FIG. 15 shows a distribution of a carrier concentration in the depth direction in the substrate when the substrate is thermally oxidized in an atmosphere which includes chromium with a parameter of the presence/absence of oxygen in an atmosphere in which the silicon substrate is inserted into a heat treatment furnace while increasing the temperature.

FIG. 15 shows a distribution of a carrier concentration in the depth direction in the silicon substrate obtained when the silicon substrate is thermally oxidized in a temperature-rising atmosphere including chromium in a heat treatment furnace with a parameter of the presence/absence of oxygen in the atmosphere. Phosphorus is added as an impurity at a concentration on the order of $4 \times 10^{14}$ atoms/cm$^3$ into the silicon substrate. The temperature $T_1$ at which the silicon substrate is inserted into the furnace is 1100° C., and the temperature increasing rate is 5° C./min.; and the thermal oxidation temperature $T_2$ is 1150° C. A silicon oxide film having a thickness of less than 20 Å is formed in the atmosphere C of oxygen. A silicon oxide film having a thickness of 300 Å is formed in an atmosphere D including an oxygen of 0.1% of $CrO_3$.

In FIG. 15, reference numeral 221 denotes a distribution of carrier concentration in the silicon substrate when the atmosphere A at insertion and the atmosphere B at temperature rising are each a nitric one including oxygen at a concentration of 10% (oxidizing atmosphere). Reference numeral 222 denotes a distribution of carrier concentration in the silicon substrate when the atmosphere A at insertion and the atmosphere B at temperature rising are each a nitric one (nonoxidizing atmosphere). When the atmospheres A and B are both the oxidizing one, the carrier concentration in the silicon substrate is substantially constant through the thickness of the silicon substrate, and no chromium is diffused into the silicon substrate. However, when the atmospheres A and B are both non-oxidizing one, the carrier concentration in the silicon substrate is decreased toward the surface of the silicon substrate, and chromium is diffused into the silicon substrate. This is because the chromium which is diffused into the silicon acts as an acceptor impurity to cancel the action of phosphorus as the donor impurity, and indicates that chromium is diffused into the silicon substrate. This change in the carrier concentration causes an unintentional change in the threshold voltage to deteriorate other electrical characteristics such as a lifetime in the silicon substrate.

Thus, in order to prevent chromium from diffusing into the silicon substrate during the thermal oxidation, the atmosphere A at insertion and the atmosphere B at temperature rising are each preferably an oxidizing one.

A table of FIG. 23 shows the change in the carrier concentration in the substrate at the formation of a silicon oxide film, for example, of a thickness of 300 Å and including a chromium component and the change in the threshold voltage with a parameter of the thermal oxidation temperature $T_2$ and the thickness of an initial oxide film before formation of the silicon oxide film including chromium. For the threshold voltage of interest, it is determined that "there is a change" when the threshold voltage is changed by 0.1 V or more relative to that of a MOS transistor processed in an oxidizing gas atmosphere including no chromium component.

It will be seen that the impurity concentration of the silicon substrate changes when the initial oxide film including no chromium component has a thickness of less than 20 Å and the thermally oxidizing temperature $T_2$ is more than 1100° C. However, the impurity concentration of the silicon substrate does not change when the initial oxide film has a thickness of 21–50 Å and the thermally oxidizing temperature is 1100° C., or when the initial oxide film has a thickness of 51–100 Å and the thermally oxidizing temperature of 1150° C., or when the initial oxide film has a thickness of more than 101 Å and the thermally oxidizing temperature is 101°–1200° C. In order to prevent chromium from diffusing into the silicon substrate, the initial oxide film is preferably thicker.

The threshold voltage may be properly changed when the initial oxide film has a thickness of less than 100 Å and the oxidizing temperature $T_2$ is in a range of 800°–1200 C. The MOS transistor is not adapted for practical use when the initial oxide film has a thickness of 101–200 Å and the oxidizing temperature $T_2$ is 1200° C., or when the initial oxide film has a thickness of less than 201–250 Å and the oxidizing temperature $T_2$ is 1100° C., or when the initial oxide film has a thickness of 250–290 Å and the oxidizing temperature $T_2$ is 900° C. Thus, when the initial oxide film is thicker, the thermal oxidation is required to be made at a lower temperature.

Thus, it will be seen that when a silicon oxide film having thickness of 300 Å is formed, the threshold voltage cannot properly be changed without causing any change in the impurity concentration even if the thickness of the initial oxide film is set to any value when the oxidizing temperature $T_2$ is 1200° C. In order to change the threshold voltage properly without causing any change in the impurity concentration, the initial oxide film is required to have a thickness of 51–200 Å when the oxidizing temperature $T_2$ is 1150° C., or a thickness of 21–200 Å when the oxidizing temperature $T_2$ is 1100° C., or a thickness of less than 250 Å when the oxidizing temperature $T_2$ is 900° or 1000° C.; or a thickness of less than 290 Å when the oxidizing temperature $T_2$ is 800° C.

The silicon oxide film may be formed by CVD method in place of the thermal oxidation method. The CVD method is LPCVD method or normal pressure CVD method.

In order to eliminate an adverse effect of chromium on the silicon substrate, a rapidly temperature-rising lamp type annealing furnace which uses a halogen or xenon light source may be used as the heat treatment furnace.

In the above embodiment, the impurity added to the silicon substrate is not limited to phosphorus, and may be another impurity such as boron, arsenic or antimony. The present embodiment is applicable to a gate oxide film of a MOS type transistor provided in a memory cell of a DRAM or the like, a tunnel oxide film used in a flash memory, a gate insulating film of a thin film transistor (TFT), etc. It is also applicable to a field transistor provided in an element isolating region and an SOI element. The gate oxide film of a MOS transistor may include a lamination structure of a silicon oxide film and a silicon nitride film such as an ONO film.

Another embodiment of the present invention will be described next with respect to FIGS. 16A–16F.

Figure 16A:
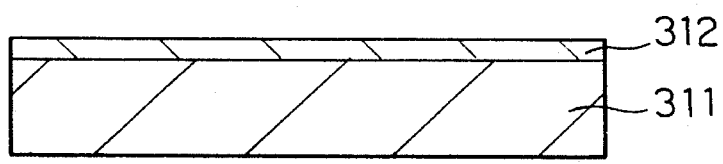
FIGS. 16A to 16F are cross-sectional views of semi-products of a MOS transistor in the respective steps of a method of manufacturing the MOS transistor according to a further embodiment of the present invention.

As shown in FIG. 16A, a surface of an n-type silicon substrate 311 including phosphorus as an impurity at a concentration on the order of $4 \times 10^{14}$ atoms/cm$^3$ is cleaned. The silicon substrate 311, thus obtained, is inserted into a heat treatment furnace such as a vertical diffusion furnace for oxidizing purpose to form a silicon oxide film 312 having a thickness on the order, for example, of 300 Å. At this time, the thermal oxidization temperature $T_1$ is set to 1,000° C., and the atmosphere is a mixture of a water vapor having a purity of 99.999% or more and oxygen.

Figure 16B:
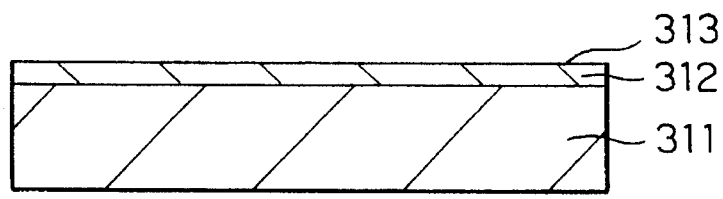

As shown in FIG. 16B, a surface of the silicon substrate 312 is coated, for example, by spin coating with a nitric solution including a chromium component. The quantity of chromium component coated is on the order of $2 \times 10^{10}$–$5 \times$ $10^{14}$ atoms/cm$^2$ less than the surface concentration of silicon atoms (on the order of $2\times10^{15}$ atoms/cm$^2$). Thus, an invisible chromium component layer 313 corresponding 0.25–0.0001 atom layer is formed. In place of the nitric acid solution including a chromium component, use may be made of an inorganic solution such as a hydrochloric acid solution, hydrofluoric acid solution, sulfuric acid solution, acetic acid solution, phosphoric acid solution, and ammonium solution or an organic solution such as an acetone solution, methanol solution, and ethanol solution or a mixture of some of the inorganic solutions or a mixture of some of the organic solutions. The chromium component layer 313 may be formed by dipping.

Figure 16C:
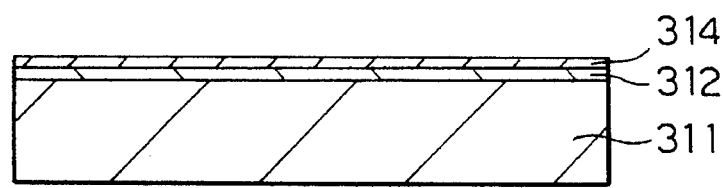

As shown in FIG. 16C, via diffusion of chromium into the silicon oxide film 312 by heat treatment, a silicon oxide film 314 including chromium is formed only in the vicinity of the surface of the silicon oxide film 312. As a condition of heat treatment for that purpose, the heat treatment temperature is preferably in a range of 450°–1150° C., and oxygen is added at a concentration of less than 6% into the heat treatment atmosphere.

Figure 16D:
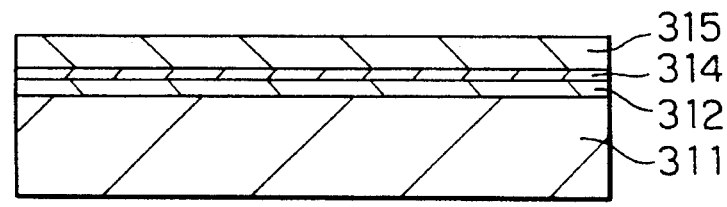

As shown in FIG. 16D, a polycrystalline silicon film 315 is deposited by LPCVD method, and an impurity is introduced into the polycrystalline silicon film 315, for example, by ion implantation to provide electric conductivity.

Figure 16E:
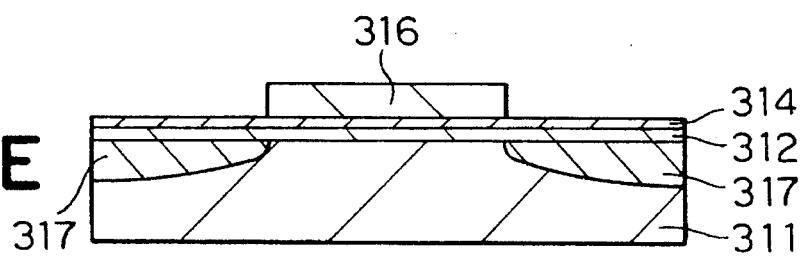

As shown in FIG. 16E, the polycrystalline silicon 315 is patterned by photolithography and dry etching to form a gate electrode 316, and a p-type impurity such as B+ or BF2' is then implanted by using the gate electrode 116 as a mask to form low concentration impurity diffusion layers 317.

Figure 16F:
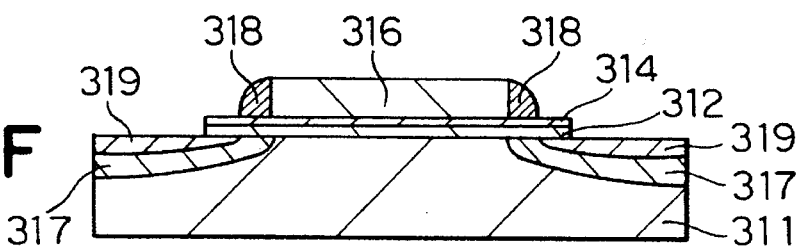

As shown in FIG. 16F, a silicon oxide film is deposited by LPCVD method. Sidewall oxide films 318 are then formed with etching-back by dry etching. A p-type impurity such as B+ or BF2+ is implanted by ion implantation by using the gate electrode 316 and sidewall oxide films 318 as a mask. Heat treatment is then performed to form high concentration impurity layers 319.

A table of FIG. 24 shows an adverse effect on a change in the carrier concentration of an n-type silicon substrate of a MOS transistor and an effect on control of the threshold voltage obtained, for example, by forming a silicon oxide film having a thickness on the order of 300 Å by thermal oxidization of an initial n-type silicon substrate including phosphorus as an impurity at a concentration on the order of $4\times10^{14}$ atoms/cm$^3$; coating the silicon oxide film with chromium at a surface density of $2\times10^{14}$ atoms/cm$^2$; and applying a heat treatment to the resulting semi-product for two hours at a temperature in a range of 200°–1200° C. in an argon atmosphere including oxygen at a concentration of 2%.

No adverse effect due to a change in the impurity concentration of the silicon substrate is recognized in the heat treatment at a temperature of less than 1150° C. An effect on control of the threshold voltage is recognized as a result of the heat treatment at a temperature of more than 450° C. Thus, when chromium is taken into the silicon oxide film for control of the threshold voltage, the heat treatment temperature is required to be set in a range of 450°–1150° C. to prevent the impurity concentration from changing.

A table of FIG. 25 shows a change in the thickness of a silicon oxide film of a MOS transistor and an effect on control of the threshold voltage of the MOS transistor obtained, for example, by forming an initial silicon oxide film having a thickness on the order of 300 Å by thermal oxidization of an n-type silicon substrate including phosphorus as an impurity at a concentration on the order of $4\times10^{14}$ atoms/cm$^3$; coating the silicon oxide film with chromium at a surface density of $2\times10^{14}$ atomscm$^2$; and applying a heat treatment to the resulting semi-product for two hours at a temperature 900° C. in an argon atmosphere including oxygen at various different densities.

The influence on the change in the carrier concentration in tables of FIGS. 24 and 25 is determined as "changed" when the carrier concentration of interest is different from the measured carrier concentration of a reference specimen including no chromium added. The effect on the threshold voltage control is determined as "effective" when the threshold voltage of interest is different by 0.1 V or more from the measured threshold voltage of the reference specimen. A change in the thickness of the oxide film is determined as "changed" when the thickness of the oxide film of interest is changed by 2 Å or more from that of the reference specimen.

When the concentration of oxygen in the atmosphere for the heat treatment is 0%, no effect on control of the threshold voltage is produced. Thus, in order to cause chromium to be taken by heat treatment into the silicon oxide film to control the threshold voltage, oxygen is required to be included in the atmosphere in the heat treatment. When the concentration of oxygen in the atmosphere in the heat treatment exceeds 6%, the thickness of the silicon oxide film would increase beyond a predetermined value. Thus, the concentration of oxygen in the atmosphere in the heat treatment is required to be less than 6%.

In order to eliminate an adverse effect of chromium on the silicon substrate, a rapidly temperature-rising lamp type annealing furnace which uses a halogen or xenon light source may be used as a heat treatment furnace. Heat treatment may be performed by laser annealing with the aid of an excimer laser.

Also, in the above embodiment, the impurity added to the silicon substrate is not limited to phosphorus and may be another impurity such as boron, arsenic or antimony. The present embodiment is applicable to a gate oxide film of a MOS type transistor provided in a memory cell of a DRAM or the like, a tunnel oxide film used in a flash memory, and a gate insulating film of a thin film transistor (TFT), etc. It is also applicable to a field transistor provided in an element isolating region and an SOI element. The gate oxide film of a MOS transistor may include a lamination structure of a silicon oxide film and a silicon nitride film such as an ONO film.

A further embodiment of the present invention will be described below with respect to FIGS. 17A–17F.

Figure 17A:
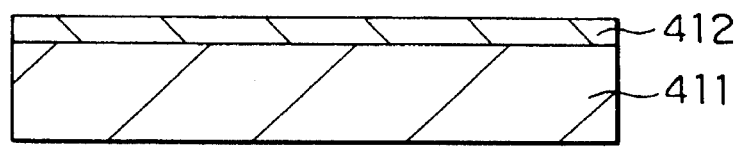
FIGS. 17A to 17F are cross-sectional views of semi-products of a MOS transistor in the respective steps of a method of manufacturing the MOS transistor according to yet a further embodiment of the present invention.

First, as shown in FIG. 17A, a surface of an n-type silicon substrate 411 including phosphorus as an impurity at a concentration on the order of $4\times10^{14}$ atoms/cm$^3$ is cleaned. The silicon substrate 411, thus obtained, is inserted into a heat treatment furnace such as a vertical diffusion furnace for oxidizing purposes to form a silicon oxide film 412 having a thickness, for example, on the order of 500 Å. At this time, the thermal oxidization temperature $T_1$ is set to 1000° C., and the atmosphere is a mixture atmosphere of a water vapor having a purity of 99.999% or more and oxygen.

Figure 17B:
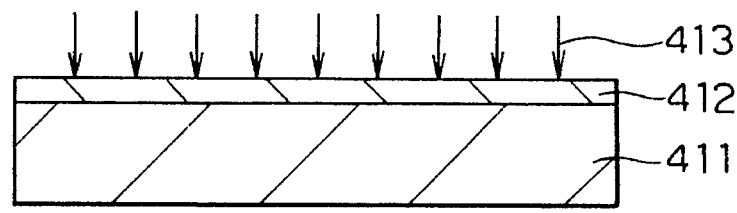

As shown in FIG. 17B, chromium ions or chromium oxide ions 413 such as $CrO_3$, $CrO_4^{2-}$ or $Cr_2O_4^{2-}$ are introduced by ion implantation into the silicon oxide film 412. At this time, the conditions of the ion implantation of 413 are such, that the dose is, for example, on the order of $5\times10^{13}$ atoms/cm$^2$ and an injection energy is, for example, on the order of 20 KeV.

Figure 17C:
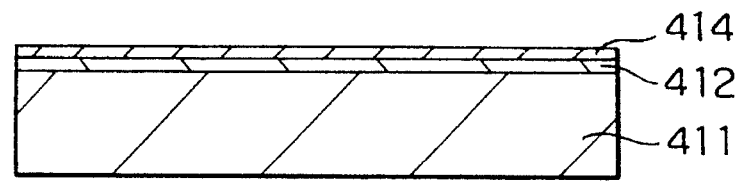

As shown in FIG. 17C, via diffusion of chromium into the silicon oxide film 412 by heat treatment, a silicon oxide film 414 which includes chromium is formed only in the vicinity of the surface of the silicon oxide film 412. As a condition of the heat treatment for that purpose, the heat treatment temperature is preferably in a range of 600°–1000° C., and oxygen is included at a concentration in a range of 2–7% in the heat treatment atmosphere. The heat treatment time is preferably in a range of 5–60 minutes.

Figure 17D:
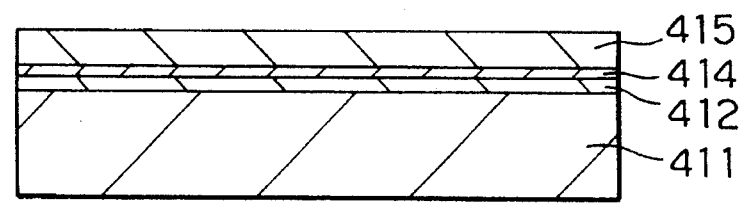

As shown in FIG. 17D, a polycrystalline silicon film 415 is deposited by LPCVD method, and an impurity is introduced into the polycrystalline silicon film 415, for example, by ion implantation to provide electric conductivity.

Figure 17E:
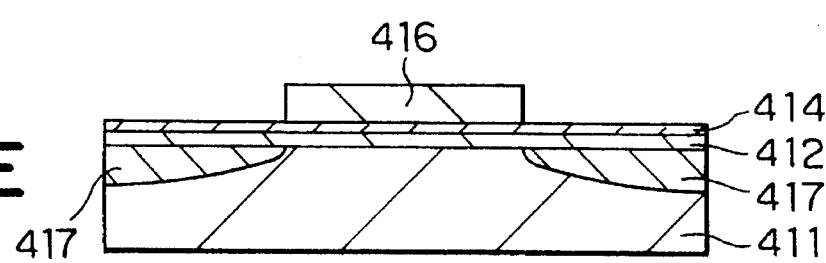

As shown in FIG. 17E, the polycrystalline silicon film 415 is patterned by photolithography and dry etching to form a gate electrode 416 to implant p type impurities such as B+ or BF2+ by using the gate electrode 416 as a mask to form low concentration impurity diffusion layers 417.

Figure 17F:
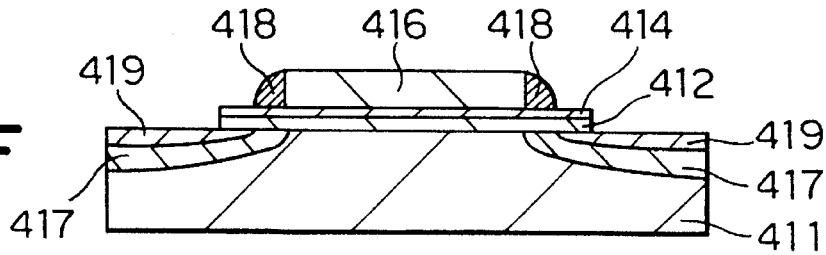

As shown in FIG. 17F, a silicon oxide film is deposited by LPCVD method. Sidewall oxide films 418 are then formed with etching-back by dry etching. A p-type impurity such as B+ or BF2+ is then implanted by ion implantation by using the gate electrode 416 and sidewall oxide films 418 as a mask. Heat treatment is then performed to form high concentration impurity layers 419.

Figure 18:
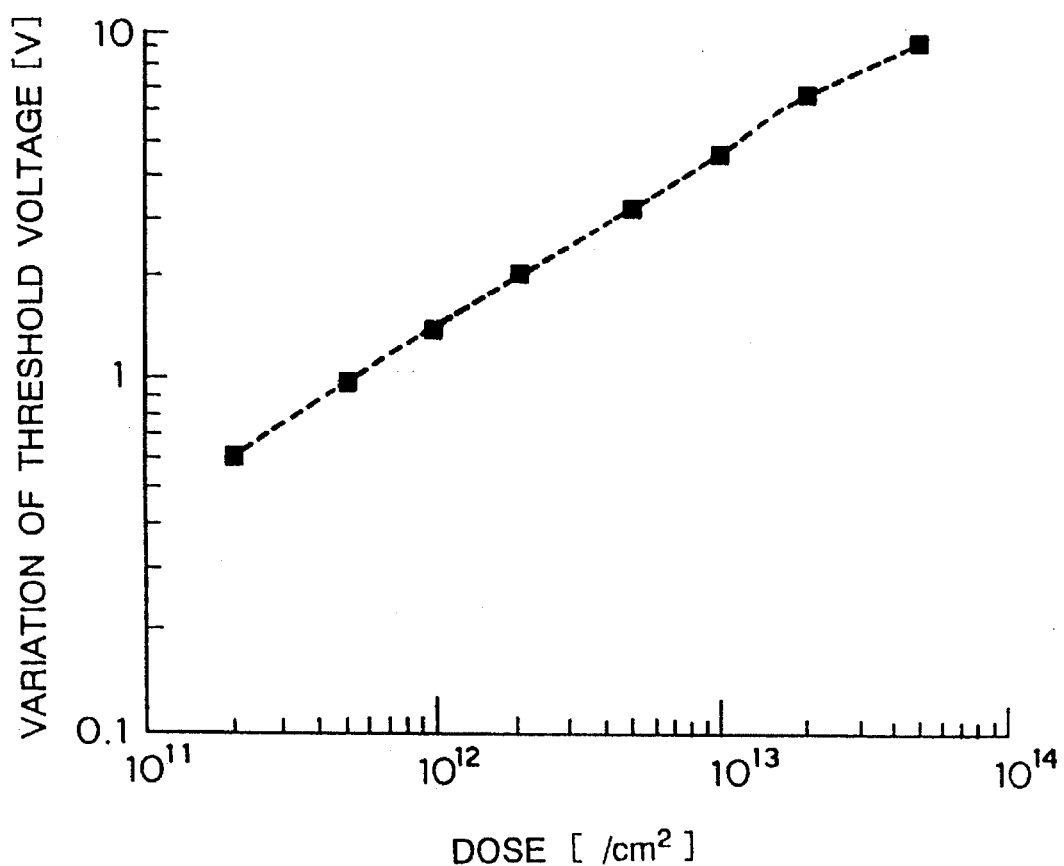
FIG. 18 is a graph of the relation between a dose of chromium ions or chromium oxide ions implanted into the silicon oxide film and the threshold voltage of the MOS transistor.

FIG. 18 shows the relation between the threshold voltage of the MOS transistor and an implantation dose of chromium ions when chromium ions or chromium oxide ions are implanted with an implantation energy of 20 KeV into a silicon oxide film having a thickness of 500 Å, and the resulting semi-product is then subjected to heat treatment at a temperature of 900° C. in an argon atmosphere including oxygen at a concentration of 5%.

In FIG. 18, the abscissa represents the implantation dose of chromium ions, while the ordinate represents an increase of the absolute value of the threshold voltage (negative value) of a MOS transistor into which chromium ions are implanted, in comparison with the threshold voltage of a NOS transistor of a reference wafer into which no chromium ions are implanted. FIG. 18 shows that the threshold voltage of the MOS transistor is selectively changeable in a range of 0.5–9 V in dependence on a change in the dose of chromium ions in a range of $2\times10^{11}$–$5\times10^{13}$ atoms/cm$^2$ when implanted into the silicon oxide film.

A table of FIG. 26 shows a change in the thickness of a silicon oxide film of a MOS transistor and an effect on the control of the threshold voltage of the MOS transistor obtained, for example, by forming an initial silicon oxide film having a thickness on the order of 500 Å by thermal oxidization of an n-type silicon substrate including phosphorus as an impurity at a concentration on the order of $4\times10^{14}$ atoms/cm$^3$; implanting chromium ions into the silicon oxide film under the conditions of injection energy of 20 KeV and an implantation dose of $5\times10^{11}$ atoms/cm$^2$; and applying a heat treatment to the resulting semi-product for 45 minutes at a temperature 900° C. in an argon atmosphere including oxygen at different densities.

The effect on control of the threshold voltage is recognized when oxygen is included at a concentration of two or more percent in the heat treatment atmosphere. When the concentration of oxygen in the atmosphere reaches 7% or more, however, the thickness of the silicon oxide film would increase so that a silicon oxide film having a thickness of a predetermined value cannot be obtained. Thus, in order to prevent the thickness of the silicon oxide film from changing when chromium is taken by heat treatment into the silicon oxide film to control the threshold voltage, oxygen is required to be included at a concentration of 2–7% in the heat treatment atmosphere. The evaluation indicated in the table of FIG. 26 is unchanged even when the atmosphere including oxygen is replaced with another non-reactive gas such as argon or nitrogen.

A table of FIG. 27 shows a change in the thickness of a silicon oxide film of a MOS transistor, a change in the carrier concentration of the silicon substrate, and an effect on the dielectric breakdown voltage of the silicon oxide film of the MOS transistor, and an effect on control of the threshold voltage of the MOS transistor, for example, obtained by forming an initial silicon oxide film having a thickness on the order of 500 Å by thermal oxidization of an n-type silicon substrate including, for example, phosphorus as an impurity at a concentration on the order of $4\times10^{14}$ atoms/cm$^3$; implanting chromium ions into the silicon oxide film under conditions of an implantation energy of 20 KeV and an implantation dose of $5\times10^{11}$ atoms/cm$^2$; and applying a heat treatment to the resulting semiproduct for 45 minutes at a temperature in a range of 300°–1100° C. in an argon atmosphere including oxygen at a concentration of 5%.

A change in the thickness of the silicon oxide film is recognized when the heat treatment temperature is at 1000° C. or more. The effect on the control of the threshold voltage of the MOS transistor is recognized when the heat treatment temperature reaches 600° C. or more. A change in the carrier concentration of the silicon substrate is recognized when the heat treatment temperature reaches 1050° C. or more. An adverse effect on the dielectric breakdown voltage of the silicon oxide film is not almost recognized when the heat treatment temperature reaches 450° C. or more. Thus, in order to cause chromium to be taken by heat treatment into the silicon oxide film to control the threshold voltage and to prevent the thickness of the silicon oxide film, the carrier concentration of the silicon substrate and the dielectric breakdown voltage of the silicon oxide film from changing, the heat treatment is required to be set to a temperature in a range of 600°–1000° C.

A table of FIG. 28 shows a change in the thickness of a silicon oxide film of a MOS transistor, a change in the carrier concentration of a silicon substrate of the MOS transistor, and an effect on the dielectric breakdown voltage of the silicon oxide film, and an effect on control of the threshold voltage of the MOS transistor obtained, for example, by forming an initial silicon oxide film having a thickness on the order of 500 Å by thermal oxidization of an initial n-type silicon substrate including phosphorus as an impurity at a concentration on the order of $4\times10^{14}$ atoms/cm$^3$ as an impurity; implanting chromium ions into the silicon oxide film under the conditions of implantation energy of 20 KeV and an implantation dose of $5\times10^{11}$ atoms/cm$^2$; and applying a heat treatment to the resulting semi-product for 0–120 minutes at a temperature of 950° C. in an argon atmosphere including oxygen at a concentration of 5%.

A change in the thickness of the silicon oxide film is not recognized before the heat treatment time exceeds 60 minutes. The effect on the control of the threshold voltage of the MOS transistor is recognized when the heat treatment time exceeds 5 minutes. A change in the carrier concentration of the silicon substrate is not recognized before the heat treatment time exceeds 50 minutes. An adverse effect on the dielectric breakdown voltage of the silicon oxide film is almost not recognized when the heat treatment time exceeds 10 minutes. Thus, in order to cause chromium to be taken by heat treatment into the silicon oxide film to control the threshold voltage and to prevent the thickness of the silicon oxide film, the carrier concentration of the silicon substrate and the dielectric breakdown voltage of the silicon oxide film from changing, the heat treatment time is required to be set in a range of 5–60 minutes.

While in the above embodiment, the method of manufacturing the MOS transistor having the gate electrode 416 composed of polycrystalline silicon including phosphorus has been described, the gate electrode may include boron in place of phosphorus. In the case of the gate electrode composed of polycrystalline silicon including boron, a change in the threshold voltage is smaller compared with the gate electrode including phosphorus. However, in the case of the boron including gate electrode, the threshold voltage is also controlled similarly. The impurity added to the silicon substrate is not limited to phosphorus and may be another impurity such as boron, arsenic or antimony. The present embodiment is also applicable to a gate oxide film of a MOS transistor disposed in a memory cell of a DRAM or the like, a tunnel oxide film used in a flash memory, and a gate insulating film of a thin film transistor (TFT), etc. It is also applicable to a field transistor provided in an element isolating region and an SOI element. The gate oxide film of a MOS transistor may include a lamination structure of a silicon oxide film and a silicon nitride film such as an ONO film. In order to eliminate an adverse effect of chromium on the silicon substrate, a rapidly temperature-rising lamp type annealing furnace which uses a halogen or xenon light source may be used as the heat treatment furnace.

According to the present embodiment, chromium is effectively included in the silicon oxide film. Thus, a MOS transistor is easily manufactured whose threshold voltage is controllable without substantially reducing the insulation property of the silicon oxide film and without substantially causing adverse effect on the electrical characteristics of the silicon substrate. Thus, the present invention is very useful for a semiconductor integrated circuit of high integration density.

What is claimed is:

1. A semiconductor element comprising:

a silicon substrate;

a silicon oxide film formed on said silicon substrate; and a top electrode formed on said silicon oxide film which includes
   chromium located only in a region of said silicon oxide film, said region being adjacent said top electrode and having a thickness of 75% or less of a thickness of said silicon oxide film for controlling a threshold voltage in said semiconductor element.

2. A semiconductor element according to claim 1, wherein the concentration of chromium included in the region of said silicon oxide film is more than $1\times10^{15}/cm^3$.

3. A semiconductor element according to claim 1, wherein said top electrode includes an impurity added at a concentration of less than $1\times10^{22}/cm^3$ for providing carriers.

4. A semiconductor element according to claim 1, wherein said silicon substrate includes an impurity added at a concentration of less than $1\times10^{20}/cm^3$ for providing carriers.

5. A semiconductor element according to claim 1, wherein the semiconductor element comprises a MOS transistor.

6. A semiconductor element comprising:

a semiconductor substrate;

an insulating film formed on said semiconductor substrate; and a top electrode formed on said insulating film which includes
   chromium located only in a region of said insulating film, said region being adjacent said top electrode and having a thickness of 75% or less of a thickness of said insulating film for controlling a threshold voltage in said semiconductor element.

7. A semiconductor element according to claim 6, wherein said insulating film is a three-layer structure of an oxide layer, a nitride layer and an oxide layer.

8. A semiconductor element according to claim 6, wherein said insulating film is an oxide film.

9. A semiconductor element according to claim 6, wherein the concentration of chromium included in the region of said insulating film is more than $1\times10^{15}/cm^3$.

10. A semiconductor element according to claim 6, wherein said top electrode includes an impurity added at a concentration of less than $1\times10^{22}/cm^3$ for providing carriers.

11. A semiconductor element according to claim 6, wherein said semiconductor substrate includes an impurity added at a concentration of less than $1\times10^{20}/cm^3$ for providing carriers.

12. A semiconductor element according to claim 6, wherein the semiconductor element is a MOS transistor.

13. A semiconductor element according to claim 1, wherein said silicon oxide film includes an oxide layer and a nitride layer.

14. A semiconductor element according to claim 6, wherein said insulating film includes an oxide layer and a nitride layer.

15. A semiconductor element comprising:

a semiconductor substrate;

an insulating film which is formed on said semiconductor substrate and comprises a first and a second portion, wherein said first portion includes substantially no chromium and said second portion includes chromium and has a thickness of 75% or less of a thickness of said insulating film for controlling a threshold voltage in said semiconductor element; and a silicon film which is formed on said insulating film and includes impurities for providing carriers.

16. A semiconductor element according to claim 15, wherein said second portion includes chromium at a concentration of more than $1\times10^{15}/cm^3$.

17. A semiconductor element according to claim 15, wherein said insulating film is a silicon oxide film.

18. A semiconductor element according to claim 15, wherein said insulating film includes an oxide layer and a nitride layer.

19. A semiconductor element according to claim 15, wherein said silicon film includes said impurities at a concentration of less than $1\times10^{22}/cm^3$.

20. A semiconductor element according to claim 15, wherein said semiconductor substrate includes impurities at a concentration of less than $1\times10^{20}/cm^3$ for providing carriers.

21. A semiconductor element according to claim 15, wherein said semiconductor element comprises a MOS transistor.

22. A semiconductor element comprising:

a semiconductor substrate;

an insulating film which is formed on said semiconductor substrate and comprises a first and a second portion, wherein said first portion includes substantially no metallic material and said second portion includes said metallic material and has a thickness of 75% or less of a thickness of said insulating film for controlling a threshold voltage in said semiconductor element; and a silicon film which is formed on said insulating film and includes impurities for providing carriers.

23. A semiconductor element according to claim 22, wherein said metallic material is a heavy metal.

24. A semiconductor element according to claim 22, wherein said second portion includes said metallic material at a concentration of more than $1\times10^{15}/cm^1$.

25. A semiconductor element according to claim 22, wherein said insulating film is a silicon oxide film.

26. A semiconductor element according to claim 22, wherein said insulating film includes an oxide layer and a nitride layer.

27. A semiconductor element according to claim 22, wherein said silicon film includes said impurities at a concentration of less than $1\times10^{22}/cm^3$.

28. A semiconductor element according to claim 22, wherein said semiconductor substrate includes impurities at a concentration of less than $1\times10^{20}/cm^3$.

29. A semiconductor element according to claim 22, wherein said semiconductor element comprises a MOS transistor.

* * * * *